United States Patent [19]
Yoneda et al.

[11] Patent Number: 5,837,568
[45] Date of Patent: Nov. 17, 1998

[54] MANUFACTURING METHOD OF SEMICONDUCTOR DEVICES

[75] Inventors: Kiyoshi Yoneda, Motosu-gun; Yoshihiro Morimoto, Inazawa; Kiichi Hirano, Anpachi-gun; Koji Suzuki; Masaru Takeuchi, both of Ogaki, all of Japan

[73] Assignee: Sanyo Electric Co., Ltd., Osaka, Japan

[21] Appl. No.: 763,556

[22] Filed: Dec. 10, 1996

[30] Foreign Application Priority Data

Dec. 12, 1995 [JP] Japan ................................. 7-323203
Feb. 29, 1996 [JP] Japan ................................. 8-043695

[51] Int. Cl.$^6$ ................................................ H01L 21/339
[52] U.S. Cl. ................... 438/147; 438/163; 438/185; 438/303
[58] Field of Search ..................... 438/147, 163, 438/185, 232, 303, 517, 521, 519; 250/492.2, 492.21, 492.3, 423, 424, 427

[56] References Cited

U.S. PATENT DOCUMENTS

| | | | |
|---|---|---|---|
| 3,909,305 | 9/1975 | Boroffka et al. | 148/1.5 |
| 4,670,064 | 6/1987 | Schachameyer et al. | 148/1.5 |
| 4,683,838 | 8/1987 | Kimura et al. | 118/715 |
| 5,219,798 | 6/1993 | Kamakura | 437/248 |
| 5,278,407 | 1/1994 | Ikebe et al. | 250/309 |
| 5,354,698 | 10/1994 | Cathey, Jr. | 437/20 |
| 5,365,070 | 11/1994 | Anderson et al. | 250/423 |
| 5,436,176 | 7/1995 | Shimizu et al. | 437/27 |
| 5,539,203 | 7/1996 | Ohdomari | 250/492.21 |
| 5,543,342 | 8/1996 | Mukai | 437/44 |
| 5,605,851 | 2/1997 | Palmieri et al. | 437/33 |
| 5,628,871 | 5/1997 | Shinagawa | 438/514 |
| 5,661,308 | 8/1997 | Benveniste et al. | 250/492.21 |
| 5,736,414 | 4/1998 | Yamaguchi | 437/21 |

FOREIGN PATENT DOCUMENTS

| | | | |
|---|---|---|---|
| 4-237162 | 8/1992 | Japan | 27/92 |
| 4-366540 | 12/1992 | Japan | 37/317 |
| 5-6754 | 1/1993 | Japan | 37/317 |
| 5-243172 | 9/1993 | Japan | 21/265 |
| 6-36740 | 2/1994 | Japan | 49/26 |
| 8-315768 | 11/1996 | Japan | 49/30 |

OTHER PUBLICATIONS

Y. Morimoto, et al., "A 2.4–in. Driver–Integrated Full–Color Quarter VGA (320X3X240). . .".

Atsushi Yoshinouchi, et al., "Poly–Silicon TFTs Fabricated at Low Temperature Using Ion Doping Technique", Central Research Laboratory, Sharp Corporation, vol. J76–C–II, pp. 276–282.

J. Tatemichi, et al., "Ion Doping System", vol. 39, No. 3 ('94. 11) pp. 52–58.

Primary Examiner—Charles L. Bowers, Jr.
Assistant Examiner—Laura Schillinger
Attorney, Agent, or Firm—Loeb & Loeb LLP

[57] ABSTRACT

To provide a manufacturing method of thin film transistors (TFT) using poly-silicone and having an LDD structure. In particular, the LDD sections of the TFTs are formed in an improved method so as to achieve a high throughput and stable performance of the TFTs. To be specific, the LD region is doped at a low concentration in the ion implantation method which includes mass spectrometry because high controllability over a dose is required. On the other hand, the source and drain regions are doped at a higher concentration than the LD region in the ion showering method which does not include mass spectrometry. Using the ion showering method, poly-crystal silicon can be doped such that less doping damage is caused thereto. This makes it possible to apply a lower temperature for annealing, such as RTA, to activate doped impurities so as to prevent the substrate from being curved. Further, combination of the ion implantation method and the showering method achieves a high throughput production of TFTs having stable performance.

23 Claims, 17 Drawing Sheets

5,837,568

MANUFACTURING METHOD OF SEMICONDUCTOR DEVICES

BACKGROUND OF THE INVENTION

1. Field of the Invention

The present invention relates to a manufacturing method of semiconductor devices, and in particular, to a manufacturing method of thin film transistors (TFTs) to be used on liquid crystal displays (LCDs).

2. Description of the Prior Art

LCDs, which are advantageous because of their small and thin shapes and low power consumption, have been in practical use in the fields of OA equipments, AV equipment and so on. In particular, LCDs of an active matrix type which employ TFTs as switching elements can theoretically perform static drive at a duty ratio of 100% in a multiplexed manner, and are applied to indicate moving images on a large display screen with high resolution.

The active matrix LCD comprises a TFT substrate on which TFTs are connected to a plurality of pixel electrodes arranged in a matrix array and an opposed substrate on which common electrodes are formed, wherein the TFT substrate and opposed substrates are attached to each other through a liquid crystal layer sealed therebetween. The regions of each of the pixel electrodes opposite to the common electrode constitute pixel capacitors using the liquid crystal layer therebetween as a dielectric layer, so that the TFTs are sequentially made electrically conductive by scanning one line at a time to thereby apply voltage to the relevant pixel capacitor. The voltage applied to the pixel capacitor is held for a period corresponding to one field due to the OFF resistance of the TFTs. Since the liquid crystal has electrooptical anisotropy, the amount of light passing through the liquid crystal layer is fine adjusted according to the strength of the field caused by the pixel capacitor, whereby light transmittance is precisely adjusted for every pixel. As a result, a desired display image, consisting of brightness of each pixel, is viewed.

By the way, poly-silicon (p-Si) has recently been used for a channel layer of TFTs, and this tendency has lead to the development of a driving circuit integrated LCD in which a section where pixels are arranged in matrix arrays (a pixel matrix section) and their associated drive circuits are formed on the same substrate. TFTs using p-Si can be constituted in a smaller size while still maintaining high resolution since p-Si generally has larger mobility than amorphous silicon (a-Si). Further, when TFTs are formed in a gate self-aligning structure, the size and parasitic capacitance of the TFTs can be further reduced, and their operating speed can be accordingly increased. Therefore, by employing the foregoing p-Si TFTs where a pixel section and driving circuits are formed on the same substrate, it is possible to constitute a high speed driving circuit such as a complementary metal-oxide semiconductor (CMOS), in which an n-ch TFT and a p-ch TFT are electrically complementarily connected to each other. To summarize, integral formation of driving circuits and a pixel matrix section on the same substrate allows reduction of manufacturing costs and production of small-size LCD modules. FIG. 1 shows the structure of a driving circuit integrated LCD, wherein the dotted line box represents a pixel matrix section. In the pixel matrix section, gate lines G1 . . . Gm for controlling on/off switching of the TFTs and drain lines D1 . . . Dn for supplying pixel signals to each pixel are arranged intersecting to each other, and TFTs 120 and pixel electrodes connected thereto are formed at respective intersections. To the right and to the left of the pixel matrix section, gate drivers GD are provided for selecting gate lines G1 . . . Gm. Above and below the pixel matrix section, drain drivers DD are provided for sampling video signals and supplying a pixel signal voltage to the respective drain lines D1 . . . Dn in synchronism with the scanning operations by the gate drivers. The drain driver DD comprises mainly a shift register circuit and a sampling circuit and occasionally a holding capacitor, while the gate driver GD mainly comprises a shift register circuit. Outside of those drivers GD, DD, input terminal pads are provided for externally supplying signals to the GDs and DDs, such as clock signals, start pulses, video signals, power voltage, and so on.

FIG. 2 shows the structure of the above TFT using p-Si, wherein p-Si is patterned into an island-like p-Si layer 101 formed on a transparent insulation substrate 100, such as glass. This p-Si layer 101 is covered by a gate insulation film 102, on which a gate electrode 103 is formed such that it opposes the p-Si layer 101. The gate electrode 103 is a polycide layer consisting of doped p-Si and silicide, or the like.

In the p-Si layer 101, there are formed source and drain regions 101S, 101D, lightly doped (LD) regions 101L, and a channel region 101N in the self-aligning structure using the gate electrode 103 as a mask. The source and drain regions 101S, 101D are a part of the p-Si layer 101 doped into an n-type semiconductor at a high concentration; the LD region is a different part of the p-Si layer 101 doped into an n-type semiconductor at a low concentration; and the channel region 101N is a still different part of the layer 101 which is not doped at all or doped into an p-type semiconductor at a low concentration.

The gate electrode 103 of a TFT for use in the pixel matrix section is formed integrally with a gate line, i.e., a scanning line, while a TFT for use in the driving circuit is connected to connection line to form a complementary structure. On the gate electrode 103, there is formed a doping stopper 105 for preventing counter-doping which is expected throughout the manufacturing process. A side wall 104 necessary for the self-aligning formation is also formed on the side surface of the gate electrode 103 and the doping stopper 105. Covering all of these, including the p-Si layer 101, the gate electrode 103, and the gate lines, a first interlayer insulation film 106 made of $SiO_2$ is formed, on which a drain electrode 107 and a source electrode 108 are further formed. These electrodes 107, 108 are made of material having a high melting point, such as Ti/AlSi, and connected to the drain and source regions 101D, 101S, respectively, via contact holes CT4, CT5 forming openings in the gate insulation film 102 and the first insulation film 106. The drain electrode 107 of a TFT for use in a pixel section is formed integrally with a drain line, i.e., a signal line, while the drain electrode 107 and the source electrode 108 of a TFT for use in a driving circuit are connected to a connection line having a complementary structure. Covering the entire drain and source electrodes 107, 108, a second interlayer insulation film 109 is formed using a method having a planarization effect, such as a spin on glass (SOG) method. As to TFTs for use in a pixel section, a pixel electrode, made of indium tin oxide (ITO), is formed on the second film 109, connecting to the source electrode 108 via a contact hole forming openings in the second film 109 above the source electrode 108.

The above described structure having an LD region 101L at a low concentration intervening between the drain region 101D and the channel region 101N is generally referred to as a lightly doped drain (LDD) structure in the LSI field. In this structure, the strong electric field at the edges of the channel region 101N is modified, so that acceleration of a carrier speed is suppressed, and withstanding voltage is thus increased. Although an LD region 101L also causes a reduction in mutual conductance by acting as a resistance, employment of TFTs of an LDD structure in a pixel section of LCD is still effective in reducing OFF current so as to increase a voltage holding ratio. As a p-Si TFT itself offers a sufficiently high ON current value, a p-Si TFT having such an LDD structure can definitely improve the ON/OFF ratio.

A manufacturing method of the above TFTs having an LDD structure will next be described.

An a-Si layer is first disposed on a glass substrate 100 through chemical vapor deposition (CVD) using either silane $SiH_4$ or disilane $Si_2H_6$ as a source gas. This a-Si layer is then poly-crystallized into a poly-silicon (p-Si) layer 101 through excimer laser annealing or lamp annealing at a substrate temperature of 200° to 400° C., preferably 400° C. This p-Si layer is subsequently etched through reactive ion etching (RIE) to thereby be formed into an island-like active layer of the TFT.

Use of a material which is highly heat resistive, such as quartz glass, for a substrate 100 allows application of various heating processes including one with a high temperature, such as 900° C. or over, to the substrate 100. In cases where such a process with a high temperature, generally referred to as a high temperature process, is applied, the a-Si layer may be poly-crystallized through a solid phase crystallization (SPC), or a p-Si layer may be firstly formed through a high temperature CVD.

As for some TFTs for use in a driving circuit, impurities, such as boron, are doped into an n-ch TFT forming region, if required, to form a p-type region as a channel region, and a $SiO_2$ film is then formed thereon by CVD, as a gate insulation film 102. Subsequently, using $SiH_4$ as a source gas, an a-Si layer is formed on the film 102 through CVD at 580° C., and this a-Si layer is then poly-crystallized into a p-Si layer through excimer laser annealing. Then, the p-Si layer is doped with phosphorous ions, so that the doped part thereof is transformed into an n-type semiconductor with lower resistance. Following that, tungsten silicide WSi is sputtered thereon, and a $SiO_2$ layer is further formed through CVD so as to be used as a doping stopper 104. These $SiO_2$, WSi, and p-Si layers are all etched together into the same pattern through RIE to thereby form a gate electrode 103 comprising a poly-Si layer and a WSi layer. In this formation of a gate electrode 103, gate lines and connection lines are also formed integrally with the gate electrodes of TFTs for use in the matrix section and those of TFTs for use in the driver circuit, respectively, wherein the gate lines connect gate electrodes of TFTs arranged in the row direction in the pixel section.

In cases where a high temperature process is applied in the above formation, a p-Si layer may first be formed through CVD at 600° to 650° C., and phosphoryl trichloride $POCl_3$ may be doped through a diffusion process for reducing resistance.

When the gate electrode 103 is completed, the source and drain regions 101S, 101D and the LD regions 101L are doped with phosphorous ions at a small dose of $1\times10^{11}$ cm$^{-2}$ to $5\times10^{13}$ cm$^{-2}$, using the gate electrode 103 as a mask. Then, after a masking resist larger than the gate electrode 103 is formed, the source and drain regions 101S, 101D are doped with phosphorous ions at a large dose of $1\times10^{14}$ cm$^{-2}$ to $1\times10^{16}$ cm$^{-2}$, preferably $7\times10^{14}$ cm$^{-2}$. In this way, an LDD structure having LD regions at a low concentration intervening between the source and drain regions 101S, 101D and the channel region 101N, respectively, is constituted. As for p-ch TFTS, source and drains regions are similarly doped with boron ions in the self-aligning method to be transformed into p-type semiconductor.

When an LDD structure is formed as described above, impurities in the doped regions 101S, 101D, 101L, 103 of the p-Si layers are activated through lamp annealing. Then, $SiO_2$ is formed as a first interlayer insulation film 106 having a thickness of 3000 to 5000 Å. Then contact holes CT4, CT5 are formed through RIE forming openings in the gate insulation film 102 and the first interlayer insulation film 106 above the drain and source regions 101D, 101S, respectively.

If a high temperature process is applied for the above formation processes, the first interlayer insulation film 106 may be made by first forming a $SiO_2$ film containing boron and phosphorous, i.e., a BPSG, through CVD and reflowing the film at 900° C.

When the contact holes CT4, CT5 are formed, Ti/AlSi is sputtered on the first interlayer insulation film 106 and patterned through RIE into a drain electrode 107 and a source electrode 108. Furthermore, drain lines for connecting drain electrodes of TFTs arranged in the column direction in the pixel section are formed together with the drain electrode 107 in the case of TFTs for use in a pixel section, and connection lines for making a CMOS circuit and lead lines are also formed in the case of TFTs for use in a driving circuit. The drain electrode 107 and the source electrode 108 are respectively connected to the drain and source regions 101D, 101S via respective contact holes CT4, CT5.

A second insulation film 109, mainly made of a SOG film, is formed for planarization, wherein the SOG film is a $SiO_2$ film formed through spin coating and annealing. As for TFTs for use in a pixel section, a contact hole is formed through RIE forming openings to the second interlayer insulation film 109 above the source electrode 108. ITO is then sputtered on the contact hole, and patterned through RIE into a pixel electrode which is connected to the source electrode 108 via the contact hole.

In the processes described above, the ion doping processes for the purpose of formation of a p-Si layer 101 having an LDD structure or reduction of resistance of the gate electrode 103 are carried out as described below.

FIG. 3 schematically illustrates an ion implanter. This ion implanter comprises an ion source 50, a lead and acceleration system 51, a mass spectrometry system 52, an acceleration system 53, a vertical scanning system 54, a horizontal scanning system 55, and a target system 56. The ion source 50, including a discharging tube having a gas inlet with an anode and a cathode provided within the tube, discharges plasma so as to produce ions. That is, the ion source 50 is supplied with a source gas such as phosphine $PH_3$, phosphorous penafluoride $PF_5$ for phosphorous ion doping, or a source gas such as boron trifluoride $BF_3$, diborane $B_2H_6$ for boron ion doping, and ionizes those gasses through discharged plasma into P+, H+, $H_2$+, or B+, F+ BF+, $BF_2$+, respectively. The thus produced ions are output as a beam current via lead electrodes disposed at the outlet of the lead system 51, and, if necessary, accelerated to turn into ion beams. These ion beams are introduced into the mass spectrometry system 52, where only necessary ions pass. To be more specific, the mass spectrometry system 52 has a fan-shaped consistent field and allows only ions of desired elements having a specified mass to pass the field, utilizing the fact that a circular orbit radius of ions differ depending on their mass. In particular, a slot provided at the outlet of the system 52 thoroughly removes unnecessary ions, so that the mass analysis is achieved more effectively. The ions having passed through the system 52 are then introduced into the acceleration system 53 of a single or multi-stages so that they are accelerated until the desired doping energy is acquired. The ion beams further pass through the vertical and horizontal scanning systems 54, 55, consisting of a pair of deflected electrodes, and finally irradiate the target system 56. The target system 56 includes a stage for supporting a target, i.e., a given electrode substrate, and various devices for convenience of attachment/removal or carriage of the electrode substrate. Particularly, the stage may be constructed so as to be movable in both the X and Y directions so as to simplify the scanning system 54, 55 or omit.

The foregoing ion doping method is particularly referred to as an ion implantation method because only desired ions are accelerated to be directly implanted into the object layer on a substrate. For lamp annealing, a rapid thermal annealing (RTA) method is particularly employed to activate impurities in the respective regions 101S, 101D, 101L, and 103 of the p-Si layer which have been doped using the ion implantation method, and to improve film quality of the gate electrode 103 including a silicide layer into silicide. In the RTA method, a substrate is scanned at a high speed by an approaching heat source, so that the substrate is not damaged by the heat while being scanned.

FIG. 4 schematically illustrates an apparatus for RTA. This RTA apparatus comprises xenon arc lamps 61 as a heat source, reflection mirrors 62, rollers 63 for transferring the substrate 60, a pre-heater 64, and a post-heater 65. The substrate 60 has an object film formed thereon. The xenon arc lamps 61 and reflection mirrors 62 are arranged above and below the path where the substrate 60 is transferring such that reflection mirrors 62 substantially surround arc lamps 61 so as to reflect the light from the relevant lamp in the direction of the path. The substrate 60 is transferred by the rollers 63 to the pre-heater 64 for pre-heating, and further to a heating area in a band consisting of the xenon arc lamps 61 and the reflection mirrors 62 surrounding them. The transferring speed of the substrate 60 can be controlled by motor (not shown) speed of the rollers 63. The substrate 60 is still heated by the post-heater 65 so that the temperature thereof will not be rapidly decreased after it comes out from the heating section. With this arrangement, the heating temperature can be controlled by adjusting a lamp power and a scanning speed which is desirably adjustable (30 mm/sec at maximum for the experimental model). Thus, by setting the substrate temperature within the range between 600° to 900° C. and the heating time at as short as one or a few seconds, it is possible to finish high temperature processing with respect to a substrate before the quality of the substrate is degraded due to heat energy absorbed by amorphous and silicide layers on the substrate.

The foregoing ion implantation is superior in controllability to a thermal diffusion method. To be more specific, by adjusting the amount of material gas, a lead voltage, and an acceleration voltage, ion forward ranges and thus a doped amount and depth can be controlled in the ion implantation method. In particular, since the horizontal diffusion length of impurities is small, and doped regions can be thus precisely defined by using mask patterns in the ion implantation method, when this method is applied to the formation of a gate of the self-aligning structure, transistors can be produced having highly stable performance and a faster operating speed.

Contrary to those advantages, the ion implantation method has such a problem that a large amount of lattice defects may be caused during ion doping processes. Although different extents of lattice defects will actually be caused depending on respective doping conditions, in general, 100 to 1000 lattice defects may be caused for every one boron B ion doped. Particularly, in doping a p-Si film, an amorphous layer, that is, an a-Si layer, is formed on the p-Si film surface region, and that causes an increase in the sheet resistance. Such lattice defects are re-crystallized by being activated through annealing. However, in a low temperature process which is applied to the formation of TFTs on an inexpensive glass substrate with low heat resistance, those lattice defects are not fully re-crystallized due to the low temperature. Such insufficiently restored lattice defects may adversely affect the performance of the TFTs.

FIG. 5 shows the relationship between a lamp power and sheet resistance of a polycide film (WSi:1000 Å/p-Si:2000 Å) used for a gate electrode and gate lines when RTA is applied to cause re-crystallization. In this drawing, Δ represents sheet resistance of a polycide film which is scanned at 12 mm/sec. The temperature of an object film is detected by a pyrometer which calculates a film temperature through optical observation of the lattice condition, and is shown in the drawing. According to FIG. 5, the sheet resistance is reduced to 2.5 kΩ/□ or less with the lamp power of 19 kw or more. This resistance value is sufficiently low for p-Si films to be used for a gate electrode and gate lines.

FIG. 6 shows the relationship between a lamp power and sheet resistance of a doped p-Si film used for source and drain regions (when the ion implantation method is utilized). In the drawing, ◇ represents a p-type p-Si film doped with a dose (a dosage amount) $1.5 \times 10^{15}$ cm$^{-2}$; ● represents an n-type p-Si film doped with a dose $3.0 \times 10^{15}$ cm$^{-2}$; and ○ represents an n-type p-Si film doped with a dose $7.0 \times 10^{14}$ cm$^{-2}$. According to the drawing, a p-type p-Si film acquires relatively low sheet resistance irrespective of a dose, presenting consistent sheet resistance of 1.4 kΩ/□ when the lamp power is 19 kW or more. On the contrary, the resistance of an n-type p-Si film doped with a dose $3.0 \times 10^{15}$ cm$^{-2}$ is extremely high when a lamp power is 19 kW or less, and plummets as the lamp power exceeds 19 kW until it reaches a consistent low level 1.4 kΩ/□ when the lamp power is 21 kW or more. In doping with a dose $7.0 \times 10^{14}$ cm$^{-2}$, the sheet resistance remains relatively high at 3 kΩ/□ when the lamp power is 18 kW or over.

In view of the above, it is known that, in phosphorous ion doping, sheet resistance is highly sensitive to a dose as well as the annealing temperature. That is, although a large amount of impurity is doped, when the annealing temperature is low, the sheet resistance becomes higher than that which would be obtained with a small dose. However, when the annealing temperature is high, the sheet resistance becomes lower when a larger amount of impurity is doped than with a smaller dose. Based on this fact, it can be assumed that ion implantation with phosphorous ions may cause a large amount of damage, that is, amorphous layers, to the object being doped, and that phosphorous elements may act to prevent re-crystallization of silicon.

FIG. 7 shows the relationship between a film temperature and a scanning speed necessary for re-crystallization of a p-Si film, wherein the same denotations represent the same conditions in FIG. 6. The dotted line indicates the maximum temperature at which a non-doped a-Si layer is re-crystallized without the risk of curving the substrate. In other words, when a substrate is heated at a temperature and a scan speed above this line, that substrate may be caused to curve. Examining this drawing in view of re-crystallization and substrate protection, it is known that the allowable temperatures and scan speeds fall in the range defined by the curved line ○ and the dotted line. To be more detailed, as is obvious from the drawing, an n-type p-Si film doped with a dose $3.0 \times 10^{15}$ cm$^{-2}$, represented by ●, is re-crystallized only at temperatures above the dotted line. This means that a low temperature process is not suitable to be applied to this film. As for an n-type p-Si film doped with a dose $7.0 \times 10^{14}$ cm$^{-2}$, this film can be re-crystallized at temperatures below the dotted line, so that a low temperature process is suitable for this film. However, it is also known from the drawing that when this film is scanned at a higher speed, the temperature must be accordingly increased for re-crystallization. Therefore when the scanning speed is 10 mm/sec or over, the film temperature exceeds the dotted line. In other words, even for this film, it is difficult to apply a faster scanning speed to thereby increase throughput. Now, see a p-type p-Si film (represented by ◇) in FIG. 7. The relevant line is located far below the dotted line. This means that this film can be re-crystallized at a low temperature at a high scanning speed.

As described thus far, the ion implantation method has a problem such that application of a low temperature process is hindered or an attempt to increase a throughput by enhancing a scanning speed is not achieved since a larger amount of energy is needed for restoration of lattice defects in doping with a larger dose.

The difficulty in increasing throughput is also related to its basic principle. That is, since impurities are uniformly doped into a substrate while the substrate is scanned by converging ion beams in the ion implantation method, this method is inevitably subject to the restriction of a spot diameter, beam currents, and so on. Due to this restriction, it takes a few to dozens of minutes to dope one substrate with a given amount of impurities, and the throughput is therefore restricted to as low as 40 sheets per day, and even fewer for a larger doping area. Worse, the relevant apparatus is inevitably large including complicated structures for a mass spectrometry system, and costly in maintenance because unnecessary ions cause damage on the inner walls of the system.

SUMMARY OF THE INVENTION

The present invention aims to provide a manufacturing method of a semiconductor device, such as a thin film transistor using a poly-crystal silicon, in which an LDD section is formed using an improved method so as to achieve a higher throughput and stable performance.

In one aspect of the present invention, there is provided a manufacturing method of a semiconductor device, comprising a first step of forming a low concentration region by doping a given region of a semiconductor layer with a small dose of first impurities which cause a conductive type; and a second step of forming a high concentration region by doping a given region which is at least partially different from the low concentration region with a large dose of second impurities which cause a same conductive type as the first impurities; wherein, in the first step, ions of the first impurities are selected through mass spectrometry from ions which have been extracted from material source containing elements of the first impurities through electrical discharging and application of a high electric field thereto, and doped in the semiconductor layer, and in the second step, ions of the second impurities are extracted together with other ions from material source containing elements of the second impurities through electrical discharging and application of a high electric field thereto, and all doped in the semiconductor layer.

With this construction, controllability in doping at a low concentration is improved through employment of an ion doping method using mass spectrometry in the doping with a small amount of first impurity ions. Further, employment of an ion doping method without using mass spectrometry in the doping with a large amount of second impurity ions allows doping with a large amount of ions. Consequently, fine adjustment and a uniformly doped amount are achieved in the doping with first impurity ions, while throughput is increased through a large amount of doping with the second impurity ions.

In another aspect of the present invention, there is provided a manufacturing method of a semiconductor device, comprising: a first step of forming a low concentration region by doping a given region of a semiconductor layer with a small dose of first impurities which cause a conductive type; a second step of forming a high concentration region by doping a given region which is at least partially different from the low concentration region with a large dose of second impurities which cause a same conductive type as the first impurities; and a third step of annealing the low and high concentration regions formed in the semiconductor layer for activation of impurities therein; wherein, in the first step, ions of the first impurities are extracted through mass spectrometry from ions which have been selected from material containing elements of the first impurities through electrical discharging and application of a high electric field thereto, and doped in the semiconductor layer, in the second step, ions of the second impurities are extracted together with other ions from material containing elements of the second impurities through electrical discharging and application of a high electric field thereto, and all doped in the semiconductor layer, and in the third step, the semiconductor layer is scanned by an approaching heat source at a given relative speed.

With this arrangement, controllability in doping at a low concentration is improved through employment of an ion doping method using mass spectrometry in the doping with a small amount of first impurity ions. Further, employment of an ion doping method without using mass spectrometry in the doping with a large amount of second impurity ions allows doping with a large amount of ions. In addition, because mass spectrometry is not utilized, doping damage and thus amorphous layers are caused less. This makes it possible to apply a lower temperature to the heat processing for re-crystallization and to increase a relative scanning speed of the heat source to shorten the time for the heat processing to thereby increase throughput.

In a further aspect of the present invention, the material containing elements of the second impurities is a gaseous mixture consisting of hydrogen and hydrogen compound of the elements of the second impurities.

With this composition, lattice defects due to doping are restored during the doping process since the hydrogen, doped together with the second impurities, has effects to promote re-crystallization. This allows application of a further lower temperature to thereby shorten the time for the heat processing for re-crystallization.

In a still further aspect of the present invention, the semiconductor layer is scanned by the heat source at a relative scanning speed of 10 mm/sec or over, preferably at 12 mm/sec.

As a result, time expended for processing one substrate is shortened to a few or tens of seconds, and throughput is accordingly increased.

In a still further aspect of the present invention, ions of the second impurities are doped with a dose $1 \times 10^{14}$ cm$^{-2}$, preferably $7 \times 10^{14}$ cm$^{-2}$ or more.

As a result, a large throughput and a high concentration doping can be achieved, while maintaining heat durability of the substrate.

In a still further aspect of the present invention, in particular, ions of the second impurities are doped with a dose $3 \times 10^{15}$ cm$^{-2}$ or more.

As a result, a larger throughput and a higher concentration doping can be achieved, while maintaining heat durability of the substrate.

In a still further aspect of the present invention, a semiconductor layer is processed at 600° C., preferably 780° C., or over.

As a result, amorphous layers are well re-crystallized through high temperature processing, and the throughput is further increased in a higher speed scanning.

The foregoing manufacturing method of a semiconductor device is applicable to thin film transistors for driving a liquid crystal and to thin film transistors formed on the same substrate as the former transistors and driving them. By applying this method to making the above thin film transistors for use in a liquid crystal display, it is possible to produce, at a high throughput, a high performance liquid crystal display known as a driver integrated type. In particular, even if an inexpensive substrate with a low heat resistance is used, a thin film transistor with stable performance and increasing ON current can be formed, at a high throughput, on such a substrate through low temperature processing free from the risk of curving the substrate.

BRIEF DESCRIPTION OF THE DRAWINGS

The above and the other objects, features, and advantages, will become further apparent from the following description of the preferred embodiment taken in conjunction with the accompanying drawings wherein.

DESCRIPTION OF THE PREFERRED EMBODIMENTS

An ion doping method, referred to as an ion showering method, will first be described. This method is different from the ion implantation method described above in the prior art section in that mass spectrometry is not utilized, and that a larger area is doped in a short time.

Figure 8:
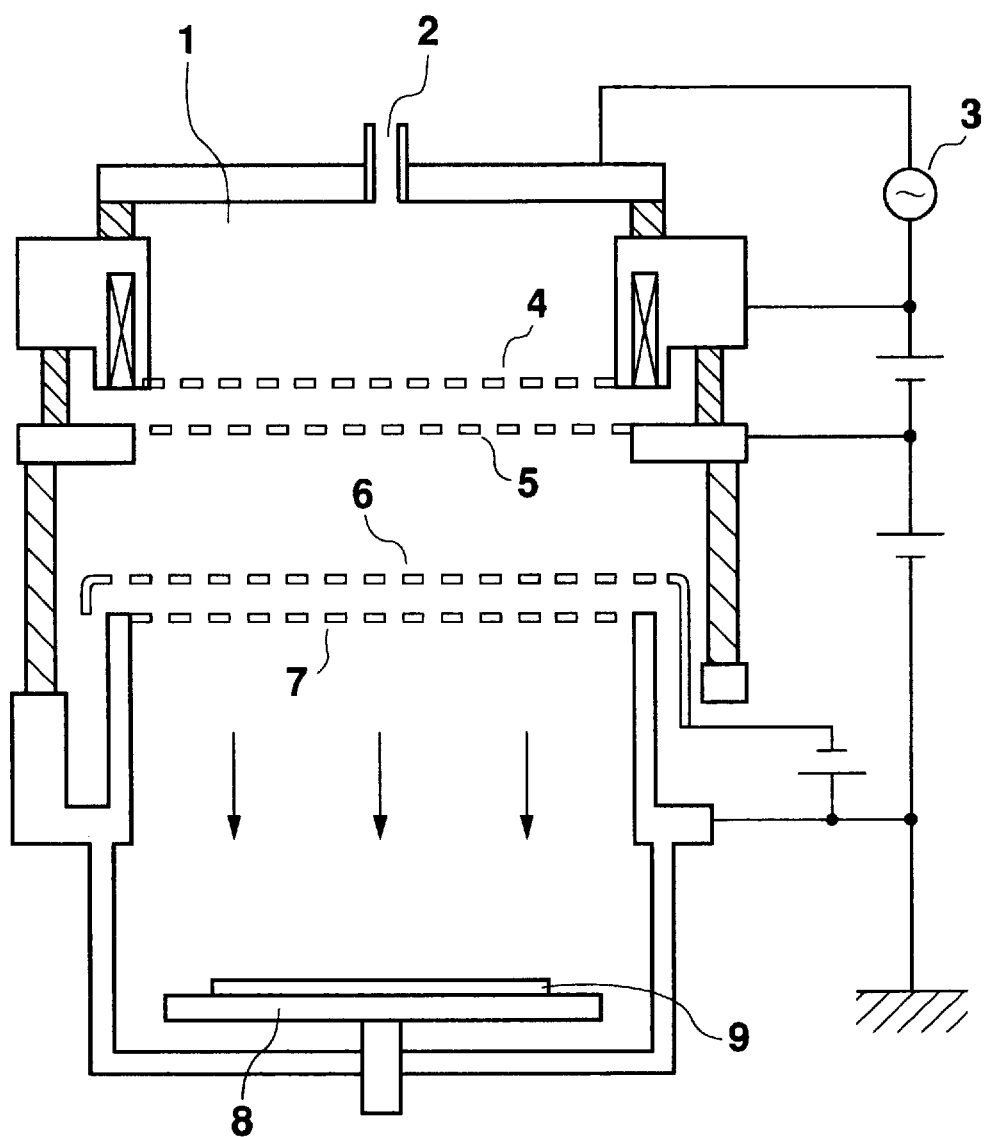
FIG. 8 schematically represents the structure of an ion showering apparatus used in the present invention.

FIG. 8 schematically shows an ion implanter for ion showering. This ion implanter comprises a plasma space 1 for supplying ions, a gas inlet 2, an RF high frequency supply 3, a lead electrode 4, an acceleration electrode 5, a suppressor electrode 6, a ground electrode 7, and a stage 8 for holding a target 9 to be doped with ions, that is, an electrode substrate in this example. A source gas is introduced via the gas inlet 2 into the plasma space 1. As a source gas, hydrogen diluted phosphine $PH_3$ is used for n-type doping, and $B_2H_6$ is used for p-type doping. The introduced material gas is ionized through high frequency discharging at 13.56 MHz to thereby produce P+, H+, $H_2$+, B+, etc. These ions are led via the lead electrodes 4 to the acceleration electrodes 5 by a lead voltage and accelerated by an acceleration voltage, and further pass through to the suppressor electrodes 6 and the ground electrodes 7 to irradiate the target 9 disposed on the stage 8 as an ion beam. While these ions pass through a few thousand fine holes formed on the respective electrodes 4, 5, 6, and 7, they are diffracted ion and overlapped on one another to be integrated into uniform ion field beam. The voltage level of the suppressor electrodes 6 is set lower than that of the ground electrodes 7 so that highly consistent ion beams are produced.

The foregoing ion showering method and a relevant apparatus are advantageous in that the beam diameter can be set at 500 mm or over since ion beams as large as a plasma space are obtainable, and that a highly uniform beam current, in other words, a beam current with uniformity within the range ±10%, can be obtained. These advantages make it possible to process the entire substrate of a maximum 500×500 mm through one doping process without the need of scanning beam lines. Consequently, the time necessary for processing one substrate is shortened to only one or two minutes, and throughput is accordingly increased significantly in comparison with the conventional ion implantation method.

Further, since mass spectrometry is not utilized and phosphorous or boron ions are doped together with hydrogen ions in the ion showering method, doping damage is reduced and even if it is caused, the damage is restored while ions are doped. In other words, when doping a p-Si film, an amorphous layer caused on the film surface due to the doping is simultaneously re-crystallized. This makes it possible to reduce the annealing temperature for activation or even to eliminate the annealing process itself.

Still further, the ion showering apparatus has a simple structure without mechanisms for mass spectrometry and scanning. Thus, the apparatus can be easily manufactured into a larger size capable of processing a larger area with an increased throughput.

On the other hand, the ion showering method suffers low controllability for small dose doping. In order to overcome this problem, the present invention employs the conventional ion implantation method for small dose doping to secure accurate control, and the ion showering method for large dose doping so as to increase throughput.

Figure 9:
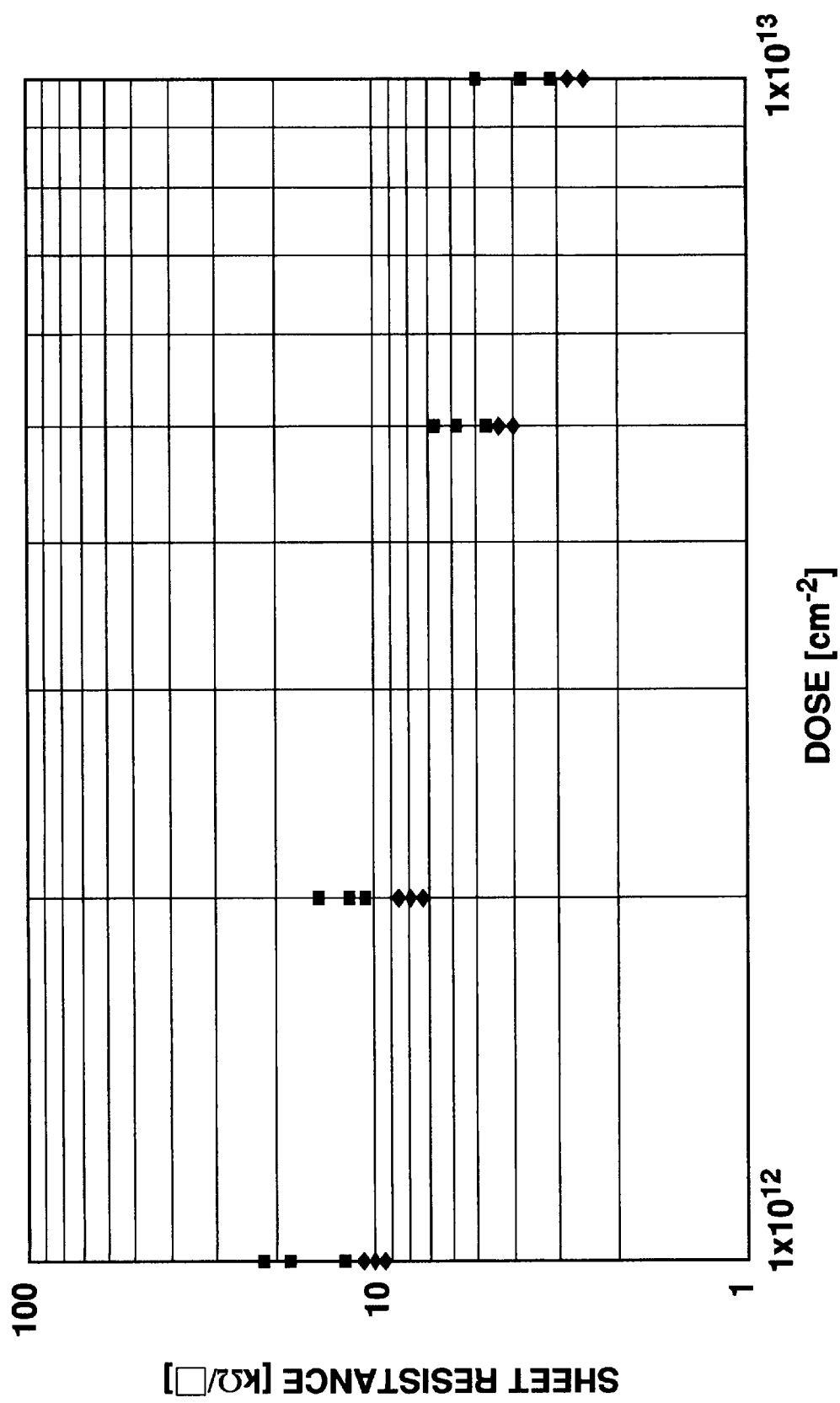
FIG. 9 shows the relationship between doses and sheet resistance for ion doping through ion implantation and ion showering.

FIG. 9 shows the relationship between sheet resistance and a dose for a small dose doping with respect to a p-Si film, wherein ♦ represents the ion implantation method, and ■ represents the ion showering method. According to this drawing, the ion implantation method offers stable resistance, whereas the ion showering method does not. To summarize, in small dose doping, the ion implantation method can achieve more precise and uniform doping than the ion showering method which suffers relatively loose control.

Figure 10:
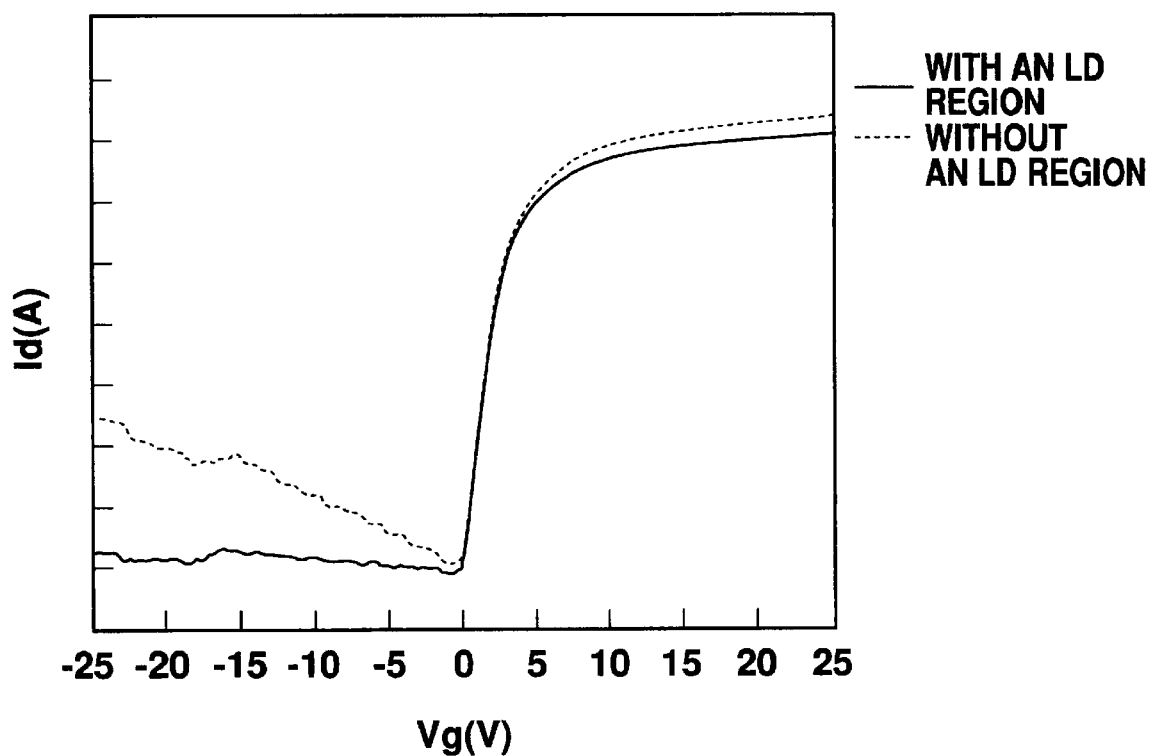
FIG. 10 shows a transfer characteristic of a TFT with and without an LD region.

FIG. 10 shows a transfer characteristic (that is, gate voltage V-drain current Id characteristic) of TFTs with and without an LD region, wherein the solid line represents a TFT with an LD region, and the dotted line represents a TFT without such a region. The value of a drain current Id is represented by a relative comparison ratio.

An LDD structure is employed in a p-Si TFT LCD mainly for the purpose of reducing a leakage current in the pixel section. That is, although p-Si TFTs have such an advantage as the sufficiently high mobility of their p-Si layer, they also have a problem such as a larger OFF current of their p-Si layer due to p-type conductance, compared to an a-Si layer, and this OFF current adversely affects the display quality of the LCD. Therefore, an LD region with high resistance is introduced to suppress such an OFF current.

The foregoing LD region is made through small dose doping with impurity ions. However, when the ion showering method is applied to this doping, a problem will be expected because the doped amount varies in this method as shown in FIG. 9, such that LD regions of some TFTs may be excessively doped and resultanly acquire only insufficient resistance to suppress an OFF current. If an OFF current is only insufficiently suppressed, it is increased instead as indicated by the dotted line in FIG. 10, causing degradation of a voltage holding ratio and thus a contrast ratio.

In order to overcome this problem, this embodiment of the present invention employs the conventional ion implantation method in doping of regions to be doped with a small dose under precise control over the dose, such as an LD region or a channel region of TFTs for use in a driving circuit, and the ion showering method for doping regions which require large dose doping, such as source and drain regions, or for acquisition of lower resistance in a gate region made of Si.

Figure 11:
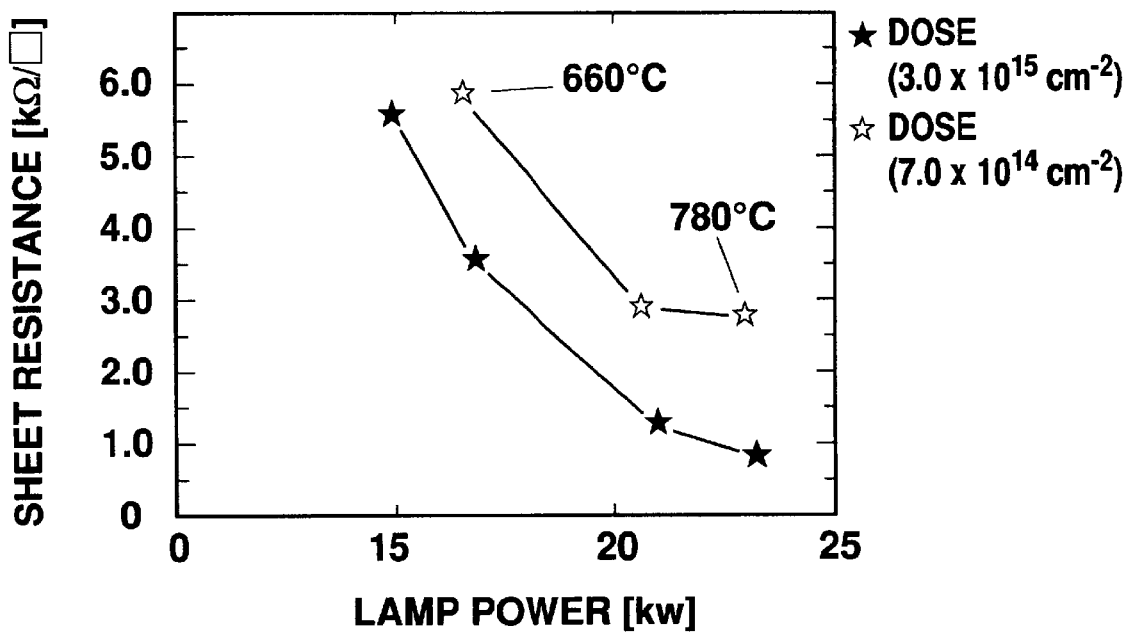
FIG. 11 shows the relationship between a lamp power and sheet resistance of a p-Si film having resistance lowered through ion showering and RTA.

FIG. 11 shows the relationship between sheet resistance and a lamp power when a p-Si film doped with phosphorous ions through ion showering is re-crystallized through rapid thermal annealing (RTA), wherein ☆ represents the dose $7.0\times10^{14}$ cm$^{-2}$, ★ represents the dose $3.0\times10^{15}$ cm$^{-2}$, and the scanning speed is 12 mm/s. The temperature of an object film is detected by a pyrometer which calculates a film temperature through optical observation of a lattice condition, and is shown in the drawing. According to this graph, a larger dose and/or a larger lamp power will result in lower sheet resistance.

Figure 6:
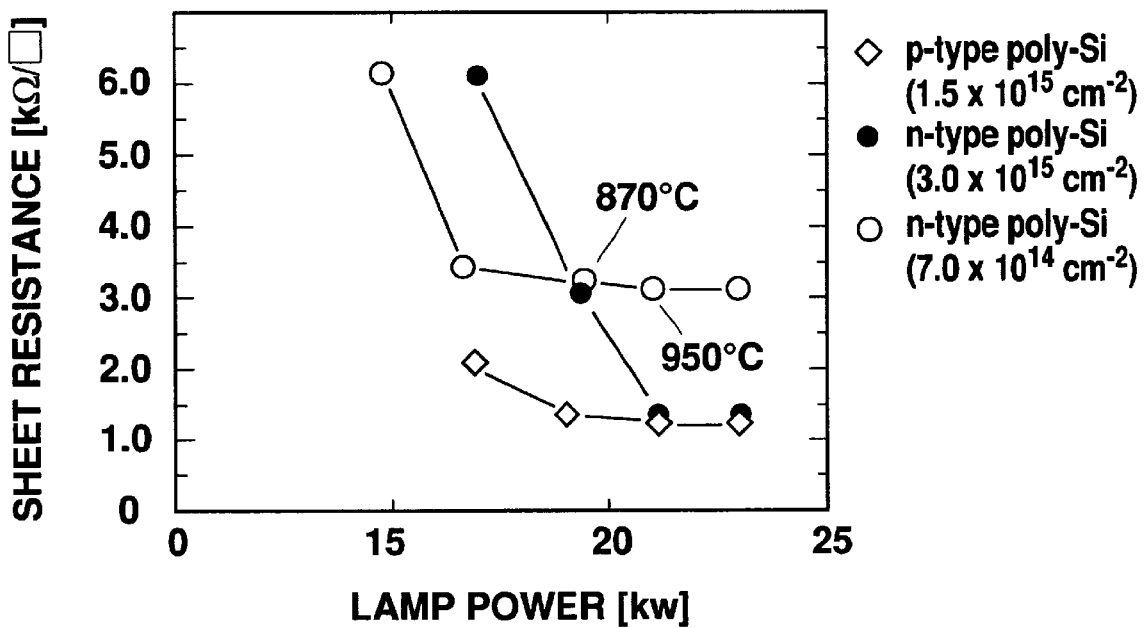
FIG. 6 shows the relationship between a lamp power and sheet resistance of a p-Si film having lowered resistance through ion implantation and RTA.

Refer also to FIG. 6 which shows the result obtained in the conventional ion implantation method, corresponding to that shown in FIG. 11. Comparison between FIGS. 6 and 11 proves that, under the same lamp power, the temperature of the p-Si film doped through ion showering is lower than that doped through ion implantation. This means that the ion showering method causes a smaller amorphous region due to doping damage than the ion implantation method, and that an amorphous region is more likely to absorb optical energy than a poly-crystal layer. To summarize, a film temperature differs depending on the condition of the formation of poly-crystal grains even under the same lamp power.

Next compare the films doped with the same dose $7.0\times10^{14}$ cm$^{-2}$ through ion showering and ion implantation. With a lamp power of 20 kW or under, the sheet resistance of the p-Si film subjected to ion showering is larger than that subjected to ion implantation. However, with a lamp power of 20 kW or over, the former is lower than the later, decreasing until 3.0 kΩ/□ or under. Since the temperature of the p-Si film subjected to ion showering is lower by almost 200° C. than that subjected to ion implantation under the same lamp power, it is concluded that, with respect to a film temperature which directly affects the heat expansion of the substrate, the p-Si film subjected to ion showering is re-crystallized, that is, it comes to have a lower resistance, at a lower temperature than that subjected to ion implantation.

Then, compare the films doped with the dose $3.0\times10^{15}$ cm$^{-2}$ through ion showering and ion implantation. The sheet resistance of the p-Si film subjected to ion showering is lower as a whole than that subjected to ion implantation, decreasing until almost 0.8 kΩ/□ with the lamp power 23 kW. Further, taking into consideration the fact that the re-crystallization temperature is lower in ion showering than in ion implantation, it is concluded that doping damage occurred in ion showering can be restored at a lower temperature for a larger dose than those in ion implantation. This is more obvious with a larger dose. That is, contrary to ion implantation, when a larger amount of impurities are doped, smaller amorphous regions are caused through ion showering, and that can bring the re-crystallization temperature. Based on this fact, it is assumed that ion showering achieves such ion doping that damage on silicon crystals is prevented or restored during the doping process.

A manufacturing method of p-Si TFTs according to the present invention will next be described with reference to accompanying FIGS. 12A–12J, and FIG. 13.

Figure 12A:
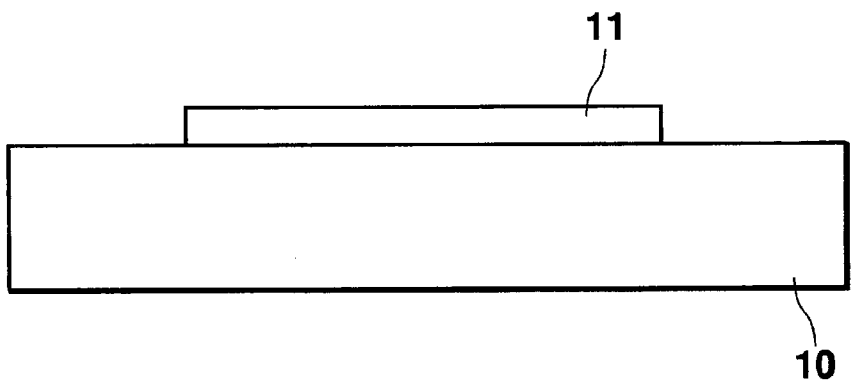
FIG. 12A is a cross section showing a manufacturing process of a TFT according to a preferred embodiment of the present invention.

Referring to FIG. 12A, an a-Si layer having a thickness of 300 to 1000 Å, preferably 500 to 600 Å, is formed on a glass substrate 10 through CVD using either silane $SiH_4$ or disilane $Si_2H_6$ as a source gas. The a-Si layer is then polycrystallized into a p-Si layer 11 through excimer laser annealing at the substrate temperature 400° C. The annealed p-Si layer 11 is etched into an island-like pattern through reactive ion etching (RIE) to thereby form an active layer of a TFT.

Figure 12B:
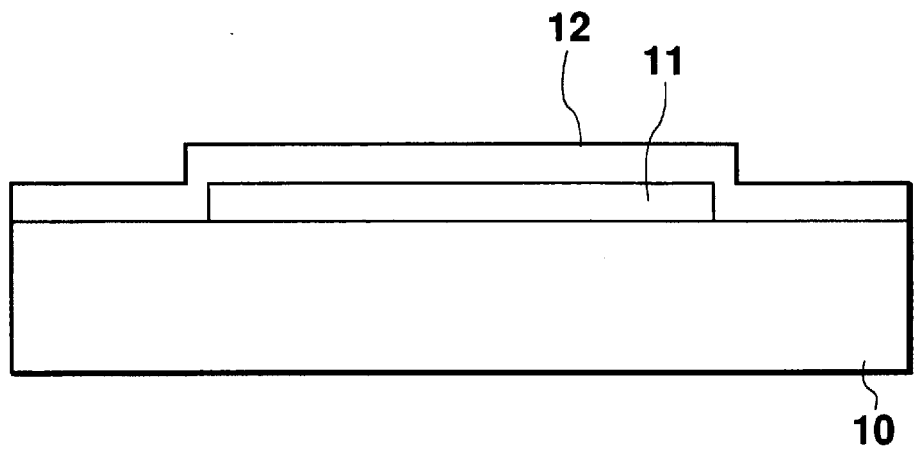
FIG. 12B is a cross section showing a manufacturing process of a TFT according to a preferred embodiment of the present invention.

Referring to FIG. 12B, $SiO_2$ is formed on the active layer 11 and the substrate 10 through chemical vapor deposition (CVD) at 400° C. with low pressure so as to form a gate insulation film 12.

Figure 12C:
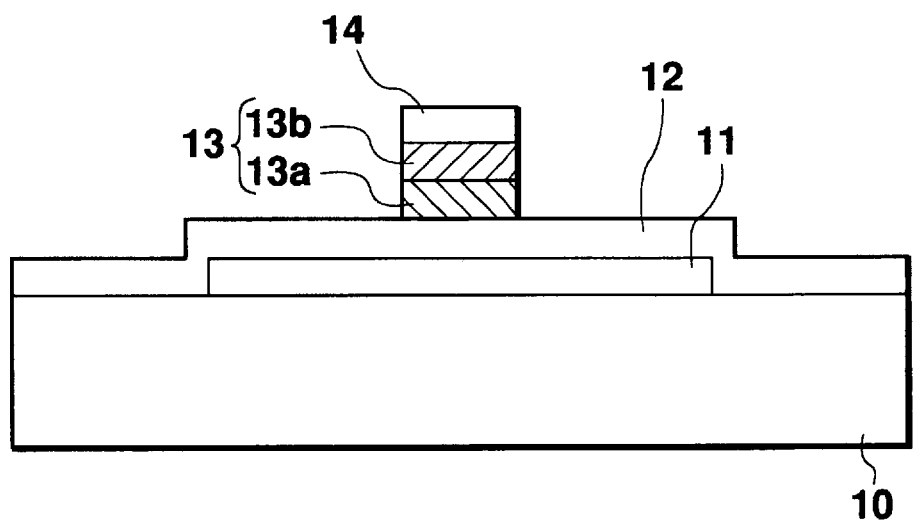
FIG. 12C is a cross section showing a manufacturing process of a TFT according to a preferred embodiment of the present invention.

Referring to FIG. 12C, an a-Si layer 13a having 2000 Å thickness is stacked on the gate insulation film 12 through high temperature CVD at 480° C. using a source gas including $SiH_4$, and the a-Si layer 13a is subsequently doped with phosphorus ions through ion showering to lower its resistance. Next, tungsten silicide WSi is sputtered onto the layer 13a to form thereon a tungsten silicide WSi layer 13b having a thickness of 500 to 1500 Å, preferably 1000 Å. $SiO_2$ is again stacked on the layer 13b through CVD at 410° C. with atmospheric pressure, to form thereon a film having a thickness of 1000 to 2000 Å, preferably 1500 Å. The $SiO_2$ layer, a-Si layer 13a and the WSi layer 13b are then etched together through RIE into the same pattern, whereby a gate electrode 13 is formed. In this formation, for TFTs for use in a pixel section, gate lines and a doping stopper 14 made of $SiO_2$ and covering the gate lines are also formed through patterning at a same time.

Figure 12D:
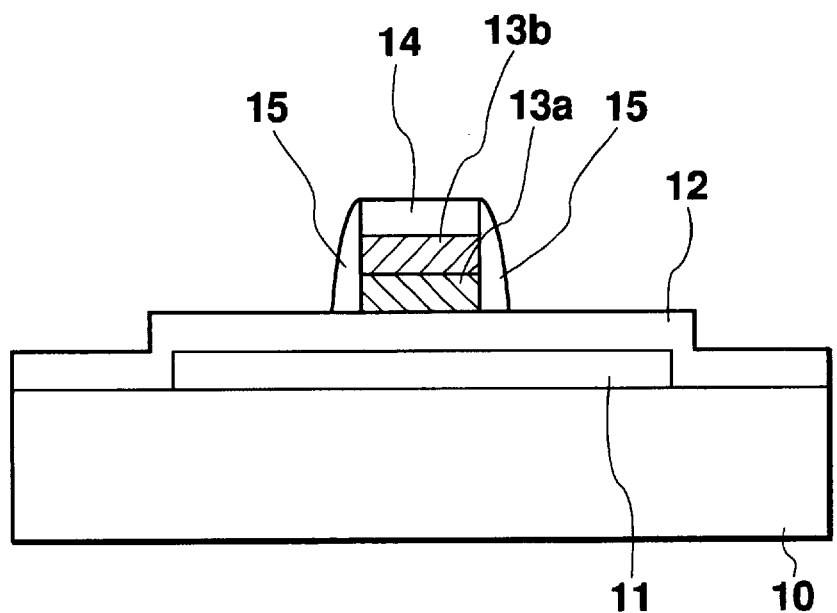
FIG. 12D is a cross section showing a manufacturing process of a TFT according to a preferred embodiment of the present invention.

Referring to FIG. 12D, $SiO_2$ is further stacked on the aforementioned layers through CVD at 410° C. with atmospheric pressure and etched through RIE into a side wall 15 adjacent to the side surface of the gate electrode 13 and the doping stopper 14.

Figure 12E:
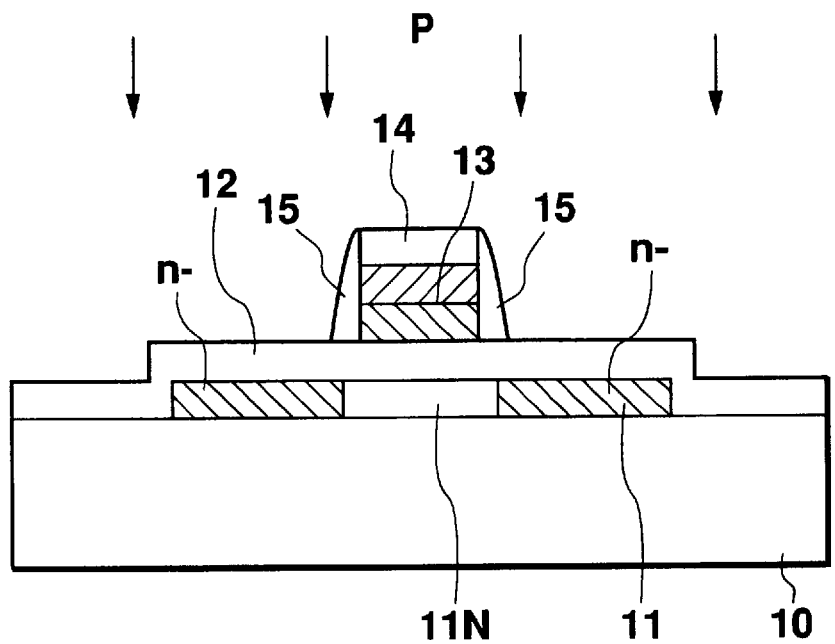
FIG. 12E is a cross section showing a manufacturing process of a TFT according to a preferred embodiment of the present invention.

Referring to FIG. 12E, using the gate electrode 13 and the side wall 15 as a mask, n-type impurity ions, such as phosphorus P, are doped into the exposed layers for the first time through ion implantation at the acceleration voltage 80 keV. The dose is then $3.0 \times 10^{13}$ $cm^{-2}$. With this ion doping, respective parts of the p-Si layer 11 reserved for source, drain, and LD regions 11S, 11D, and 11L are doped at a low concentration (n−) in a self-aligning method utilizing the gate electrode 13 and the side wall 15, and the part of the Si layer 11 directly under the gate electrode 13 is left not doped to constitute a channel region 11N. The side wall 15 acts in this doping process to set a margin for preventing horizontal diffusion of phosphorus ions due to subsequent annealing and to reduce a doping concentration at the ends of the channel region to thereby modify the drain field and to increase breakdown voltage.

Figure 12F:
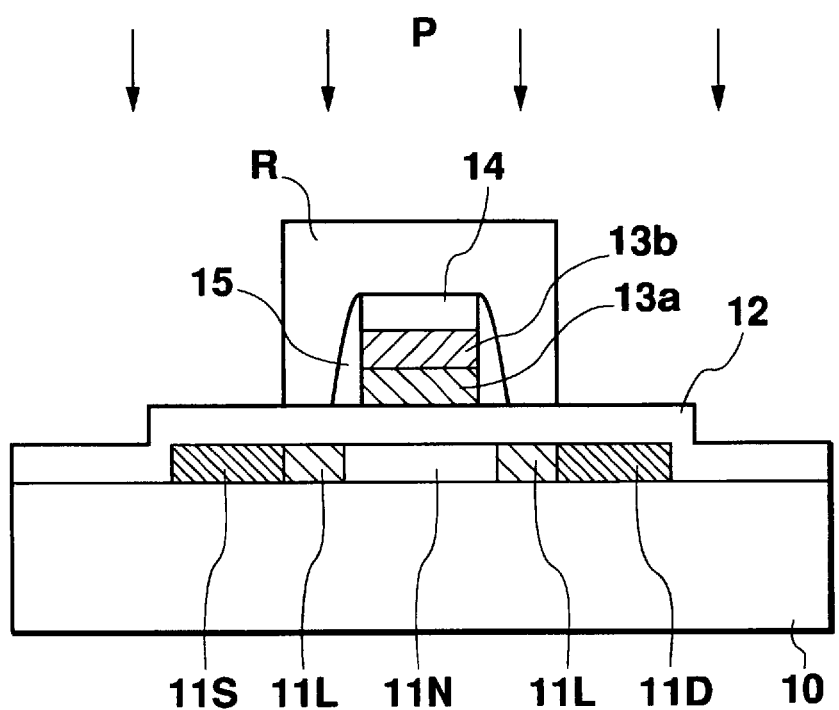
FIG. 12F is a cross section showing a manufacturing process of a TFT according to a preferred embodiment of the present invention.
Figure 12G:
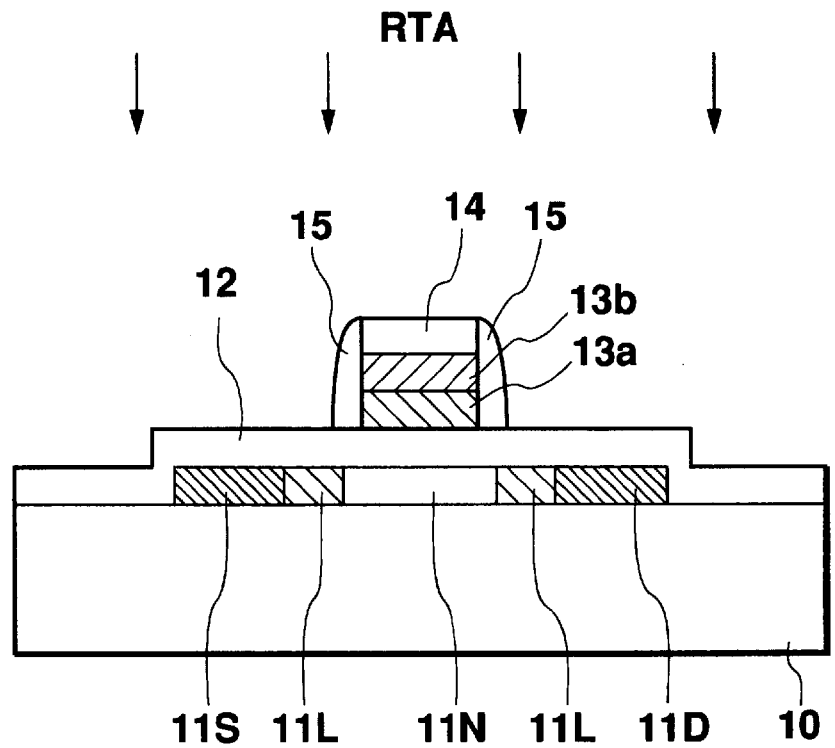
FIG. 12G is a cross section showing a manufacturing process of a TFT according to a preferred embodiment of the present invention.

Referring to FIG. 12F, after the gate electrode 13 is fully covered with a resist R larger than the electrode 13, phosphorous ions are doped into the layers for the second time through ion showering using the resist R as a mask at the acceleration voltage 90 keV and a lead voltage 10 keV. The dose is then between $1.0 \times 10^{14}$ $cm^{-2}$ and $5.0 \times 10^{15}$ $cm^{-2}$, i.e., $7.0 \times 10^{14}$ $cm^{-2}$, for instance. With this doping, the parts of the p-Si layer 11 directly below the resist R are left at a low concentration (n−) to constitute LD regions 11L. Outwardly adjacent to the LD regions 11L, a source region 11S and a drain region 11D are formed, both doped at a high concentration (n+).

Note that employment of the ion showering method in the above doping processes results in a significant increase of a throughput from 40 sheets to 200 sheets per day.

As for p-ch TFTs, source and drain regions are similarly formed in a self-aligning method.

When the drain and source regions are thus formed, the layers are annealed through RTA to activate the doped regions 11L, 11S, and 11D of the p-Si layer and to polycrystallize a-Si 13a into p-Si 13a so that the resistance of those regions and layer is reduced. In addition, since p-Si 13a is thus formed, polycide gate 13 having WSi layer 13b and p-Si layer 13a is formed.

Figure 5:
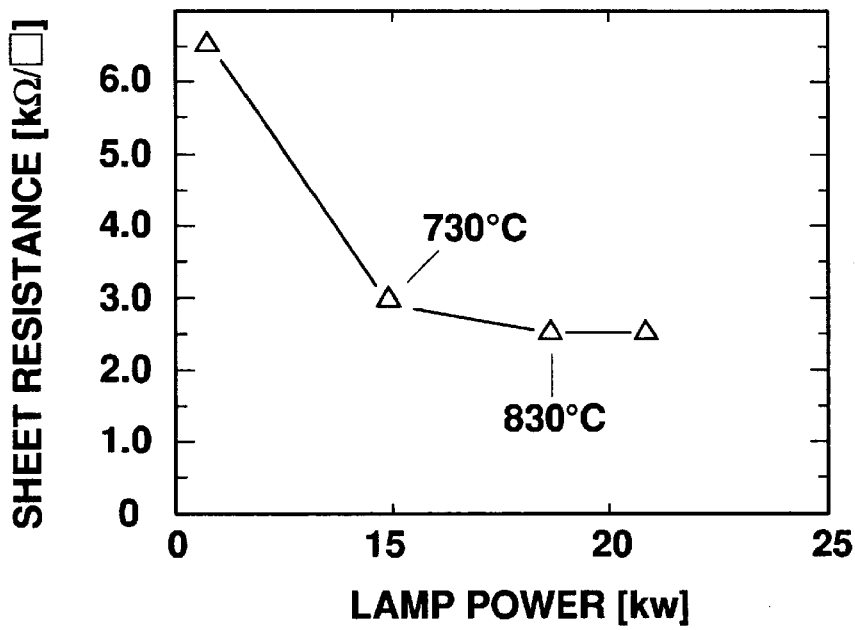
FIG. 5 shows the relationship between a lamp power and sheet resistance of a tungsten polycide film formed through ion implantation and RTA.

In this annealing, the resistance of polycide or p-type p-Si can be sufficiently lowered even in the ion implantation method as shown in FIGS. 5 and 6. (Note that the ion showering method can offer a further lowered resistance.)

Figure 7:
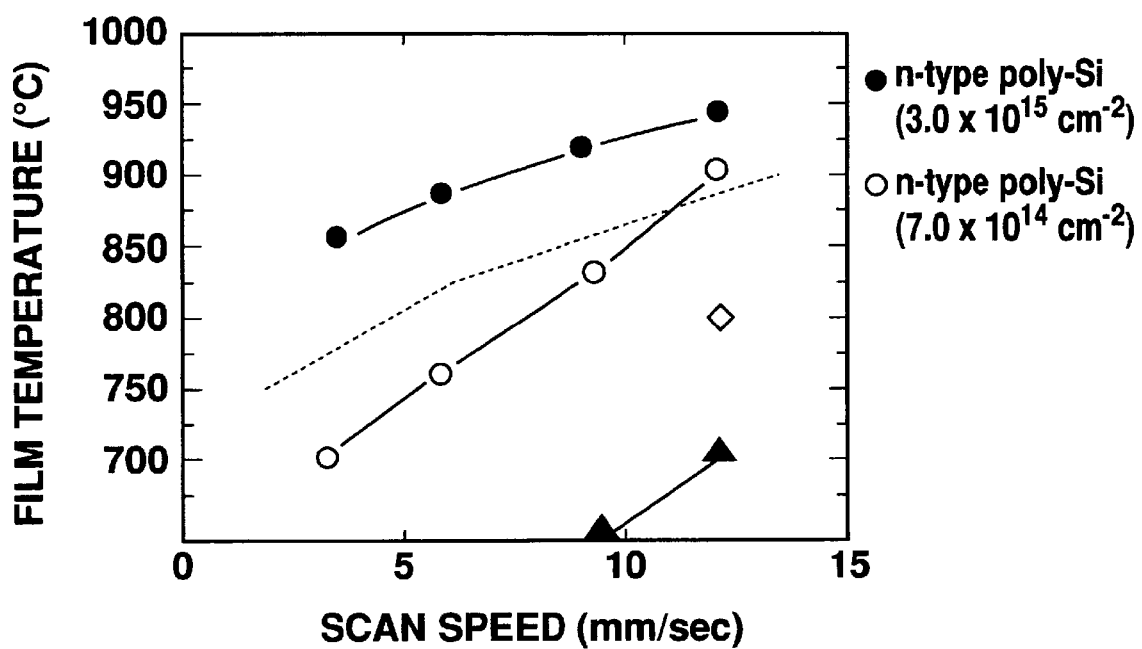
FIG. 7 shows the relationship between a film temperature and a scanning speed necessary for reducing resistance of a p-Si film formed through ion implantation or ion showering.

However, as to n-type p-Si, it is necessary to carefully determine and set a lamp power, a process temperature, and a scanning speed, taking account of both durability against heat of the substrate and re-crystallization of the p-Si film. In cases of the dose $7.0 \times 10^{14}$ $cm^{-2}$, the allowable temperatures and scanning speeds in view of re-crystallization and substrate protection are those falling on the range defined by the dotted line and the curved line with ○ in FIG. 7 when the ion implantation method is employed. However, when the ion showering method is employed instead, this range is expanded to the one defined by the dotted line and the curved line with ▲, which is lower than the curved line with ○ by almost 200° C. In FIG. 7, wherein ▲ represents n-type p-Si film doped with a dose $7.0 \times 10^{14}$ $cm^{-2}$ through ion showering. Referring to FIG. 11, when the scanning speed and the lamp power are set at 12 mm/s and 23 kW, respectively, the resistance of the object film becomes 2.7 kΩ/□ at the object film temperature 780° C. The point representing such a scanning speed and a film temperature falls in this expanded range in FIG. 7, i.e., far below the dotted line. This means that this point achieves both re-crystallization and substrate protection. To summarize, when the ion showering method is applied, it is possible to process a substrate with heat at 600° C. or over, which is the maximum temperature without expansion of a soda glass substrate, and further at 780° C. or over, at which sheet resistance becomes sufficiently low at 2.7 kΩ/□. It is further known that the scanning speed can be set at 12 mm/s, at least 10 mm/m or over.

In cases of the dose $3.0 \times 10^{15}$ $cm^{-2}$, according to FIG. 11, a still lower sheet resistance is obtained than that in the above cases of the dose $7.0 \times 10^{14}$ $cm^{-2}$. Considering the fact that re-crystallization and resistance reduction can be achieved at a lower temperature by about 200° C. in ion showering than in ion implantation, it is known that re-crystallization and resistance reduction can be achieved in the range below the dotted line in FIG. 7. This means that a low temperature process is applicable for ion doping with this dose $3.0 \times 10^{15}$ $cm^{-2}$ through ion showering.

Figure 12H:
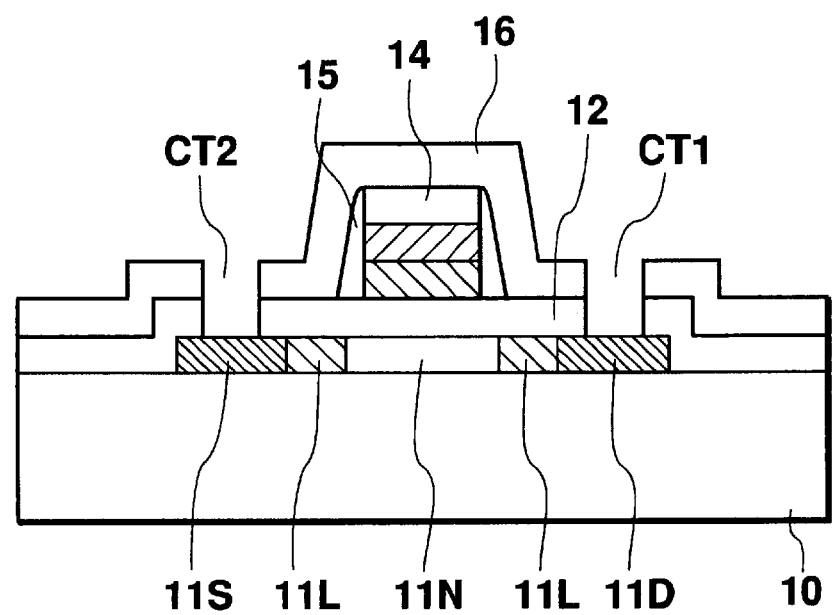
FIG. 12H is a cross section showing a manufacturing process of a TFT according to a preferred embodiment of the present invention.

Referring to FIG. 12H, a $SiO_2$ film having 2000 Å thickness is formed through CVD at 410° C. with atmospheric pressure and then annealed at 600° C., and another $SiO_2$ film having 3000 Å thickness is superimposed on the former $SiO_2$ film through plasma CVD at 300° C. Those films constitute a first interlayer insulation film 16. Thereafter, contact holes CT1, CT2 are formed through RIE forming openings to the gate insulation film 12 above the drain and source regions 11d, 11S, respectively.

Figure 12I:
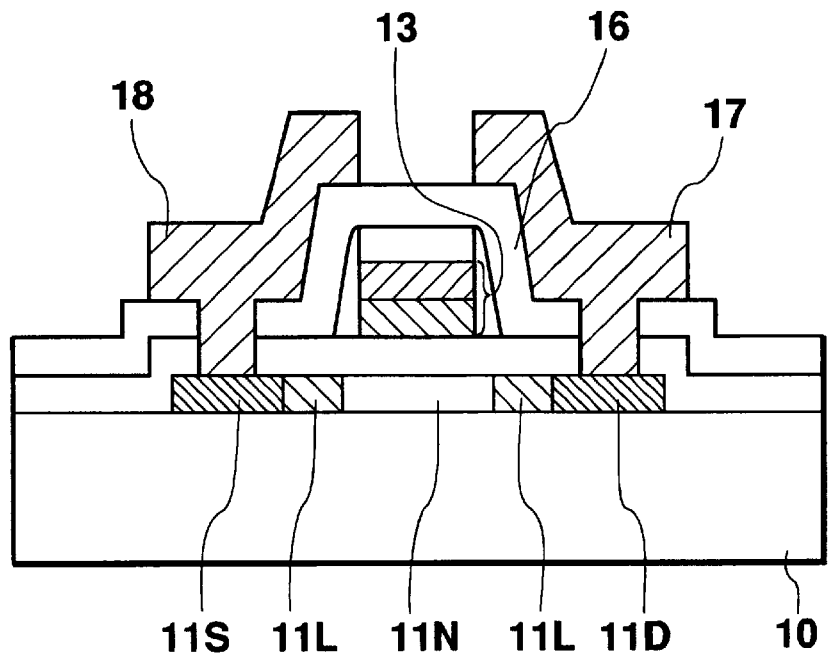
FIG. 12I is a cross section showing a manufacturing process of a TFT according to a preferred embodiment of the present invention.

Referring to FIG. 12I, Ti/AlSi is sputtered onto the layers formed thus far to be stacked thereon to a thickness of 7000 Å. The Ti/AlSi layer is then patterned through RIE to form a drain electrode 17 and a source electrode 18 such that they are respectively connected to the drain and source regions 11D, 11S via the contact holes CT1, CT2.

Figure 12J:
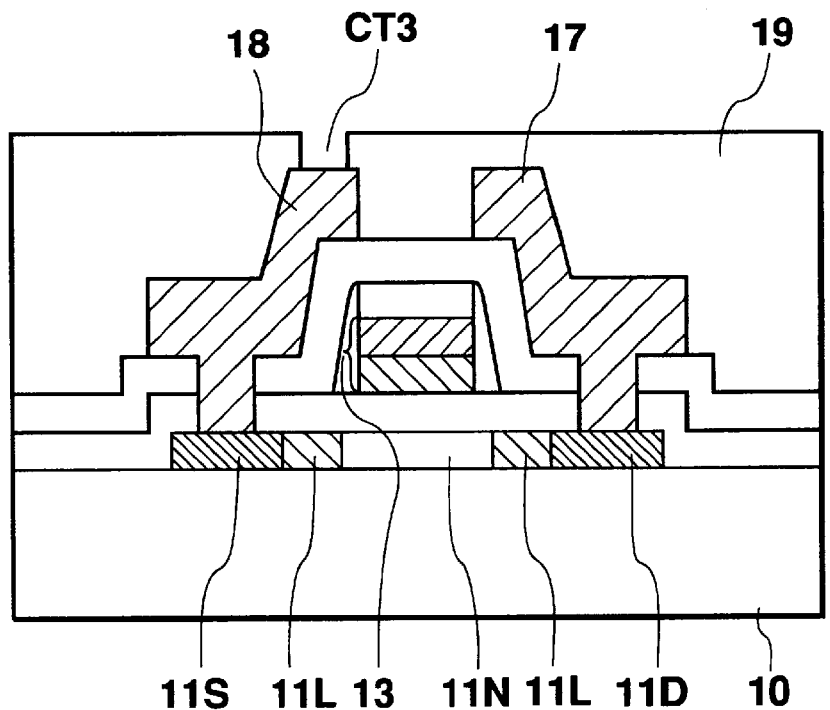
FIG. 12J is a cross section showing a manufacturing process of a TFT according to a preferred embodiment of the present invention.

Referring to FIG. 12J, an SiO$_2$ layer having a thickness of 2000 Å is stacked on the external layers through CVD at 410° C.; an SiO$_2$ film formed through spin coating and annealing, i.e., an SOG film, is covered thereon and its surface is flattened; and another SiO$_2$ film having a thickness of 1000 Å is stacked thereon. Those three layers together constitute a second interlayer insulation film 19. Then, forming openings to this insulation film 19, a contact hole CT3 is formed through RIE.

Figure 13:
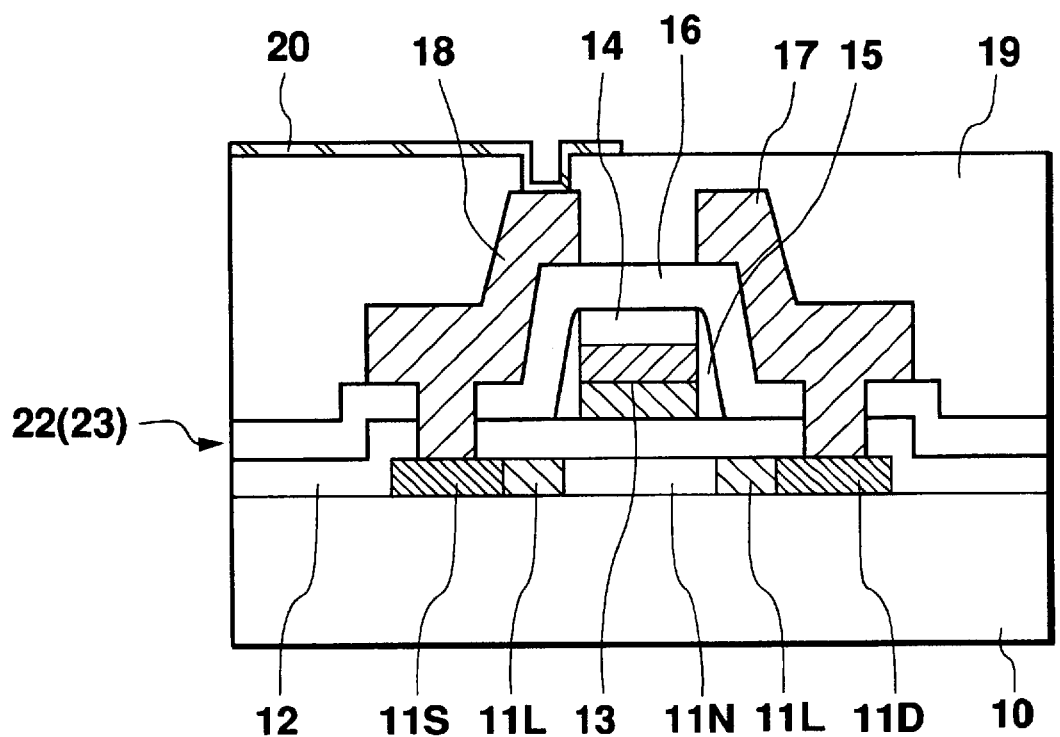
FIG. 13 is a cross section showing a manufacturing process of a TFT and the structure of a finish TFT according to the preferred embodiment of the present invention.

Finally, referring to FIG. 13, as to TFTs for use in the pixel section, ITO is sputtered onto the second insulation film 19 to form a film thereon, and the ITO film is then patterned into a pixel electrode 20 which is connected to the source electrode 18. In this way, TFTs 22 for use in a pixel region are made.

Figure 1:
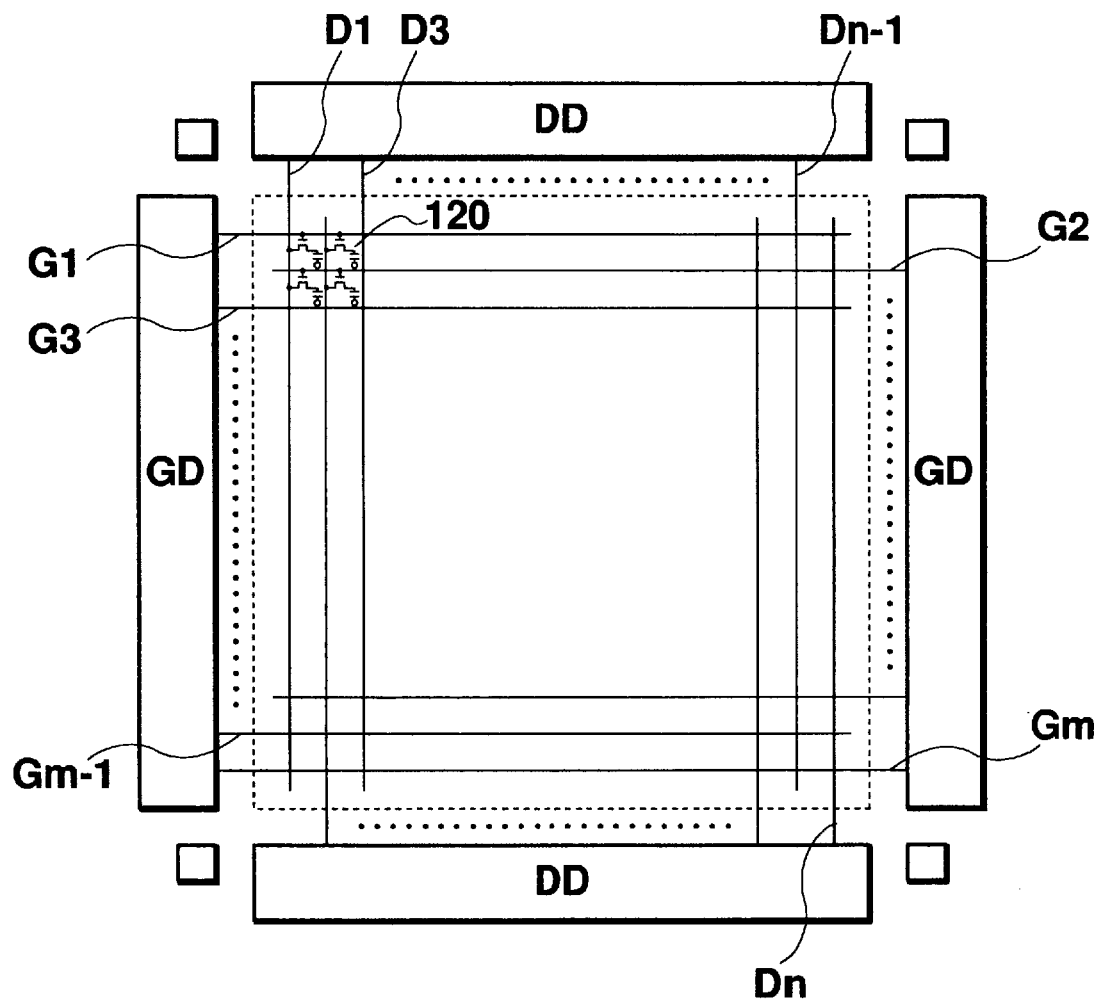
FIG. 1 illustrates the structure of a liquid crystal display incorporating a driving circuit.
Figure 2:
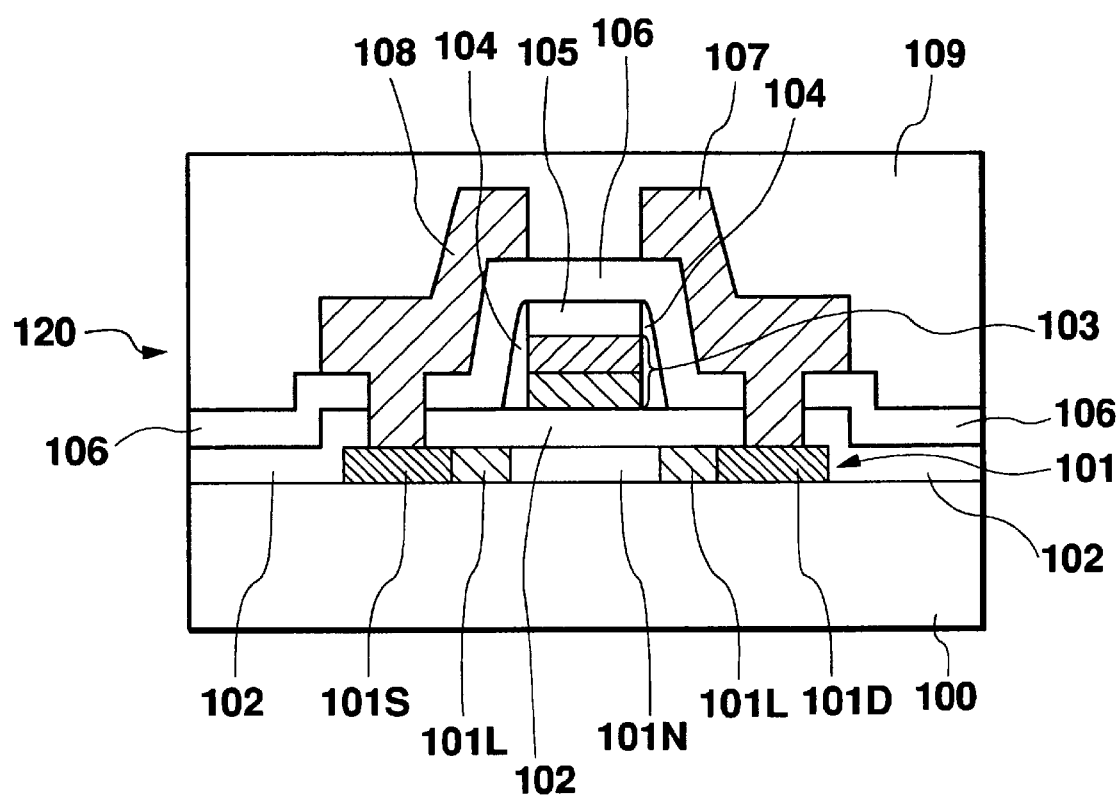
FIG. 2 is a cross section of a conventional TFT transistor.
Figure 3:
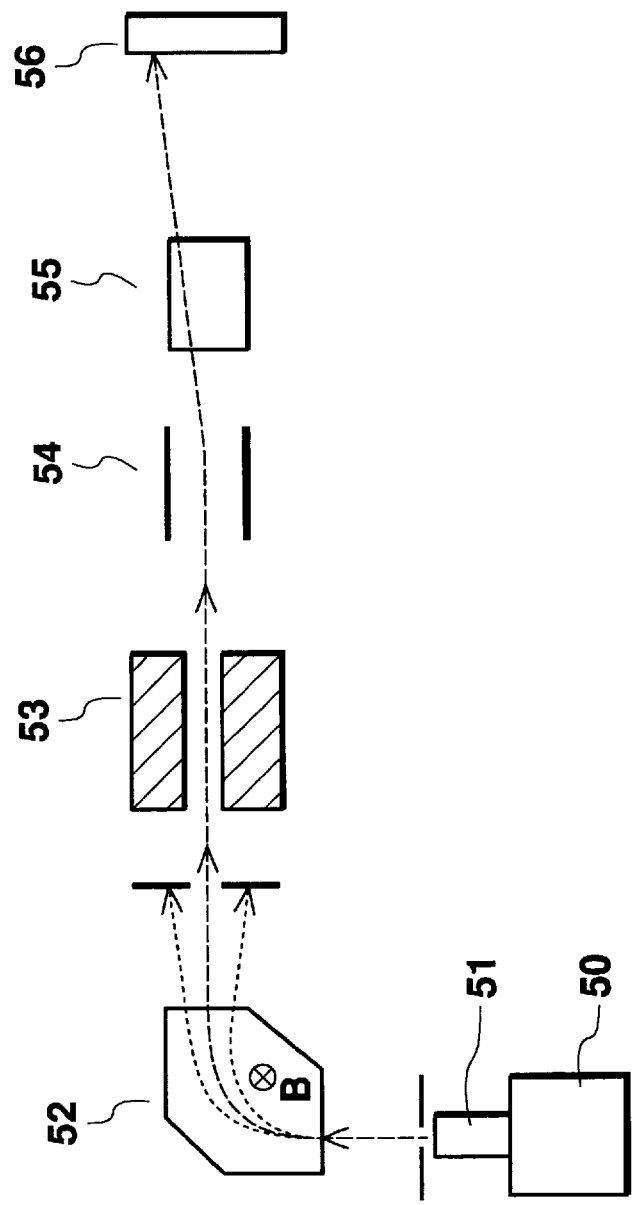
FIG. 3 schematically represents the structure of an ion implanter.
Figure 4:
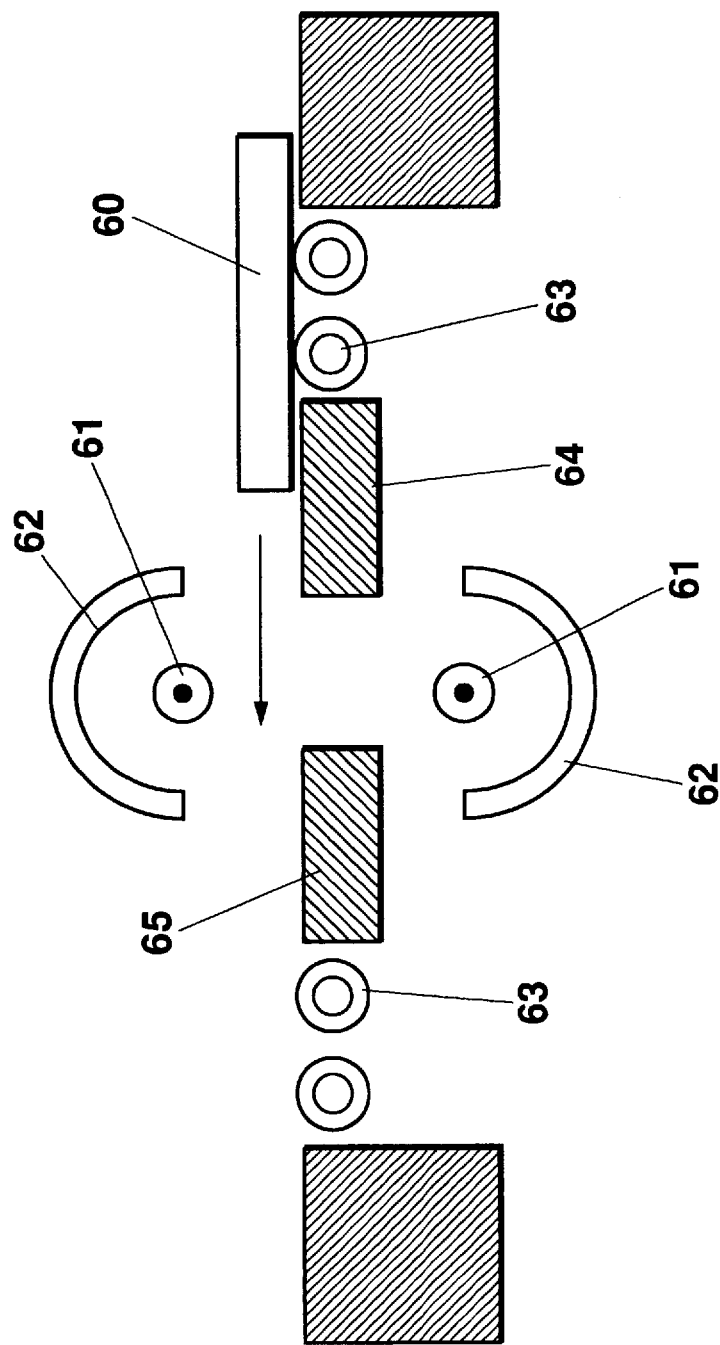
FIG. 4 schematically represents the structure of an RTA apparatus.
Figure 14A:
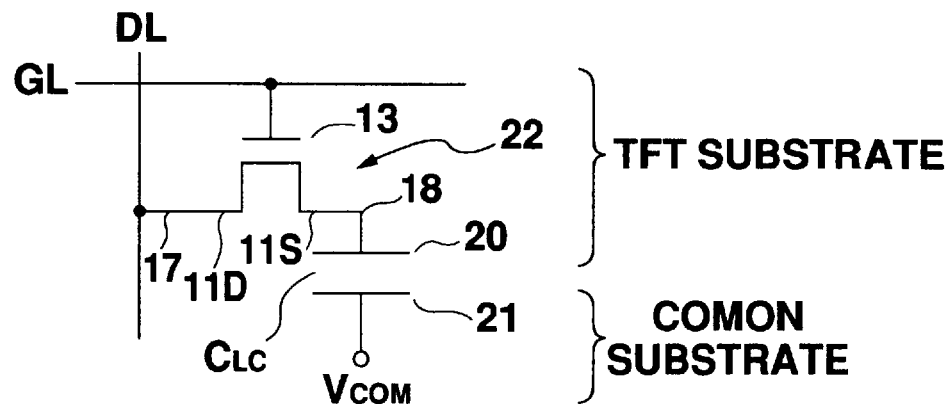
FIG. 14A schematically represent the circuit structure of a liquid crystal display employing a TFT for driving liquid crystal according to the preferred embodiment of the present invention.
Figure 14B:
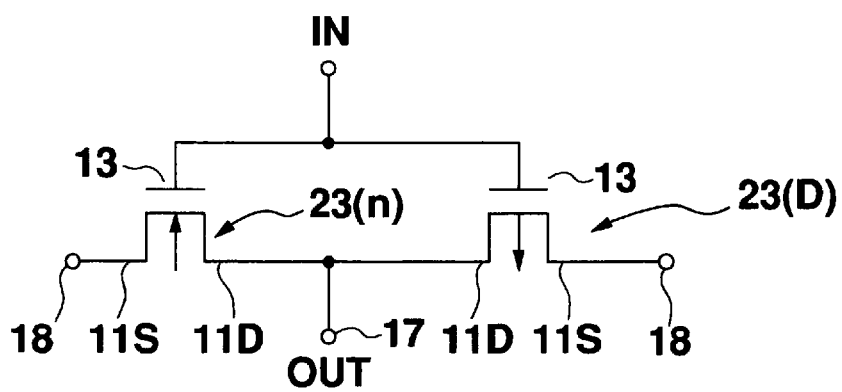
FIG. 14B schematically represent the CMOS circuit structure of a TFT for driving either a gate or a drain according to the preferred embodiment of the present invention.

As for TFTS for use in driving circuits GD, DD (see FIG. 1), the foregoing TFT 23 is formed so as to have a complementary MOS (CMOS) structure as shown in FIG. 14B, in which an n-ch TFT 23n and a p-ch TFT 23p are connected to each other such that their gate electrodes 13 are connected to a common input terminal IN. In this case, the source electrodes 18 are not connected to a pixel electrode 20, but are instead connected to respective corresponding power lines, or the like. The drain regions 11D of the TFTs 23n, 23p are structured using a common island region, although drain regions 11D are structured individual island and drain electrodes 17 may be connected to each other. The drain electrodes 17 are connected to the output terminal OUT of the CMOS, so that the output terminal OUT outputs a signal to subsequent circuits or TFTs 22 in the pixel section in response to a signal supplied via the input terminal IN. The positional relationship between the source and drain regions 11S, 11D of the TFTs 22, 23 is not limited to the one shown in FIGS. 14A and 14B. Instead, their positions may be exchanged such that the drain region 11D of the TFT 22 may be connected to the pixel electrode 20 via the drain electrode 17 in FIG. 14A, or the respective source regions 11S of the TFTs 23n, 23p may be structured using a common island region in the CMOS structure in FIG. 14B.

When TFTs for use in a pixel section and TFTs for use in a driving circuit are made as described above, then a TFT substrate can be completed using those TFTs.

By the way, a common substrate, shown in FIG. 14A, is provided on its entire surface with a common electrode made of ITO. When a TFT substrate is attached to a common substrate through a liquid crystal layer interposed therebetween, whereby a liquid crystal display is constituted. When a TFT 22 at a desired position on the TFT substrate is driven by a gate/drain driving driver, a liquid crystal capacitor sandwiched by the pixel electrode 20 connected to the TFT 22 selected and the opposed common electrode 21 is driven.

As is obvious from the foregoing description, in the manufacturing method of TFTs having an LDD structure according to the preferred embodiment of the present invention, the ion implantation method is employed only for the formation of regions at a low concentration, securing high controllability and suppressing reduction of throughput. In addition, the ion showering method is employed for the formation of regions at a high concentration, achieving a significant increase of a throughput. With this construction, it is possible to make TFTs presenting favorable performance with for low manufacturing costs.

Further, for activation of doped regions through RTA, regions subjected to ion showering can be activated at a lower annealing temperature at a higher scanning speed. Therefore, it is possible to eliminate adverse effects on the substrate as well as to shorten the annealing time to thereby increase throughput.

What is claimed is:

1. A manufacturing method of a semiconductor device, comprising:

a first step of forming a low concentration region by doping a given region of a semiconductor layer with a small dose of first impurities which cause a conductive type; and a second step of forming a high concentration region by doping a given region which is at least partially different from the low concentration region with a large dose of second impurities which cause a same conductive type as the first impurities;

wherein, in the first step, ions of the first impurities are selected through mass spectrometry from ions which have been extracted from material source containing elements of the first impurities through electrical discharging and application of a high electric field thereto, and doped in the semiconductor layer, and in the second step, ions of the second impurities are extracted together with other ions from material source containing elements of the second impurities through electrical discharging and application of a high electric field thereto, and all doped in the semiconductor layer.

2. A manufacturing method of a semiconductor device as defined in claim 1, wherein the material source containing elements of the second impurities is a gaseous mixture consisting of hydrogen and hydrogen compound of the elements of the second impurities.

3. A manufacturing method of a semiconductor device as defined in claim 2, wherein the ions of the second impurities are doped with a dose $1\times10^{14}$ cm$^{-2}$ or more.

4. A manufacturing method of a semiconductor device, comprising:

a first step of forming a low concentration region by doping a given region of a semiconductor layer with a small dose of first impurities which cause a conductive type;

a second step of forming a high concentration region by doping a given region which is at least partially different from the low concentration region with a large dose of second impurities which cause a same conductive type as the first impurities; and a third step of annealing the low and high concentration regions formed in the semiconductor layer for activation of impurities therein;

wherein, in the first step, ions of the first impurities are selected through mass spectrometry from ions which have been extracted from material containing elements of the first impurities through electrical discharging and application of a high electric field thereto, and doped in the semiconductor layer, in the second step, ions of the second impurities are extracted together with other ions from material containing elements of the second impurities through electrical discharging and application of a high electric field thereto, and all doped in the semiconductor layer, and in the third step, the semiconductor layer is scanned by an approaching heat source at a given relative speed.

5. A manufacturing method of a semiconductor device as defined in claim 4, wherein the material containing elements of the second impurities is a gaseous mixture consisting of hydrogen and hydrogen compound of the elements of the second impurities.

6. A manufacturing method of a semiconductor device as defined in claim 5, wherein the semiconductor layer is scanned by the heat source at a relative scanning speed of 10 mm/sec or over.

7. A manufacturing method of a semiconductor device as defined in claim 5, wherein the ions of the second impurities are doped with a dose $1 \times 10^{14}$ cm$^{-2}$ or more.

8. A manufacturing method of a semiconductor device as defined in claim 5, wherein the semiconductor is scanned by the heat source at 600° C. or over.

9. A manufacturing method of a semiconductor device as defined in claim 4, wherein the semiconductor layer is scanned by the heat source at a relative scanning speed of 10 mm/sec or over.

10. A manufacturing method of a semiconductor device as defined in claim 4, wherein the semiconductor layer is scanned by the heat source at a relative scanning speed of 12 mm/sec or over.

11. A manufacturing method of a semiconductor device as defined in claim 4, wherein the ions of the second impurities are doped with a dose $1 \times 10^{14}$ cm$^{-2}$ or more.

12. A manufacturing method of a semiconductor device as defined in claim 4, wherein the ions of the second impurities are doped with a dose $7 \times 10^{14}$ cm$^{-2}$ or more.

13. A manufacturing method of a semiconductor device as defined in claim 4, wherein the ions of the second impurities are doped with a dose $3 \times 10^{15}$ cm$^{-2}$ or more.

14. A manufacturing method of a semiconductor device as defined in claim 4, wherein the semiconductor layer is scanned by the heat source at 600° C. or over.

15. A manufacturing method of a semiconductor device as defined in claim 4, wherein the semiconductor layer is scanned by the heat source at 780° C. or over.

16. A manufacturing method of a semiconductor device as defined in claim 4, wherein the semiconductor layer is scanned by the heat source at a relative scanning speed of 12 mm/sec or over, and the ions of the second impurities are doped with a dose $7 \times 10^{14}$ cm$^{-2}$ or more.

17. A manufacturing method of a semiconductor device as defined in claim 4, wherein the semiconductor layer is scanned by the heat source at 780° C. or over at a relative scanning speed of 12 mm/sec or over.

18. A manufacturing method of a semiconductor device as defined in claim 4, wherein the ions of the second impurities are doped with a dose $7 \times 10^{14}$ cm$^{-2}$ or more, and the semiconductor layer is scanned by the heat source at 780° C. or over at a relative scanning speed of 12 mm/sec or over.

19. A manufacturing method of thin film transistors formed on one of a pair of substrates having liquid crystal display interposed therebetween and altogether constituting a liquid crystal display, thin film transistors for driving the liquid crystal for every pixel and thin film transistors for driving the thin film transistors for driving the liquid crystal, comprising:

a step of forming a semiconductor layer on the substrate, a step of forming a low concentration area by doping a given region of the semiconductor layer with a small dose of ions of first impurities which cause a conductive type, in which the ions of the first impurities are selected through mass spectrometry from ions which have been extracted from material containing elements of the first impurities through electrical discharging and a high electrical field thereto, and a step of forming a high concentration area partially adjacent to the low concentration region by doping a given region which is at least partially different from the low concentration region in the semiconductor layer with a large dose of ions of second impurities which cause the same conductive type as the first impurities, in which the ions of the second impurities are extracted together with other ions through electrical discharging and application of a high electric field thereto, and all doped into the part of the low concentration region to form the high concentration region.

20. A manufacturing method of a thin film transistor as defined in claim 19, further comprising a step of annealing the semiconductor layer by scanning with an approaching heat source at a given relative speed for activation of impurities in the low and high concentration regions.

21. A manufacturing method of a thin film transistor as defined in claim 20, wherein the semiconductor layer is scanned by the heat source at a relative speed of 12 mm/sec or over, and the ions of the second impurities are doped with a dose $7 \times 10^{14}$ cm$^{-2}$ or more.

22. A manufacturing method of a thin film transistor as defined in claim 20, wherein the semiconductor layer is scanned by the heat source at 780° C. or over at a relative scanning speed of 12 mm/sec or over.

23. A manufacturing method of a thin film transistor as defined in claim 20, wherein the semiconductor layer is scanned by the heat source at 780° C. or over at a relative scanning speed of 12 mm/sec or over, and the ions of the second impurities are doped with a dose $7 \times 10^{14}$ cm$^{-2}$ or more.

* * * * *